(12) United States Patent
Ichikawa

(10) Patent No.: US 6,294,228 B1
(45) Date of Patent: Sep. 25, 2001

(54) METHOD FOR FORMING THIN FILMS

(75) Inventor: Masashi Ichikawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/432,759

(22) Filed: Nov. 3, 1999

(30) Foreign Application Priority Data

Nov. 4, 1998 (JP) ................................................. 10-313724

(51) Int. Cl.⁷ ........................................................ C23C 8/00
(52) U.S. Cl. .................. 427/585; 427/140; 427/255.395; 427/374.1; 427/398.1; 427/402
(58) Field of Search ..................... 427/585, 140, 427/255.395, 374.1, 398.1, 402

(56) References Cited

FOREIGN PATENT DOCUMENTS

| 0 892 083 A1 | 1/1999 | (EP) . |
| 57-159015 | 10/1982 | (JP) . |
| 7-263370 | 10/1995 | (JP) . |
| 8-45859 | 2/1996 | (JP) . |

OTHER PUBLICATIONS

European Search Report dated Feb. 29, 2000.
Japanese Office Action dated Oct. 24, 2000, with partial English translation.

*Primary Examiner*—Bernard Pianalto
(74) *Attorney, Agent, or Firm*—McGinn & Gibb, PLLC

(57) ABSTRACT

A reactor furnace, in which a plurality of silicon nitride film forming processes have been performed to produce a desired thin film, is changed in temperature from its film-forming temperature to another one lower than the film-forming temperature before an unnecessary silicon nitride film cracks of itself in the reactor furnace, so that the unnecessary silicon nitride film is intentionally subjected to stress and cracked, whereby the unnecessary thin film is relieved from stress. After that, the thus cracked film is covered with another silicon nitride film serving as a repair film, to prevent the unnecessary thin film from producing contaminant particles in forming the desired thin film.

13 Claims, 17 Drawing Sheets

22; unnecessary silicon nitride film
23; crack
24; repair film (silicon nitride film)

METHOD FOR FORMING THIN FILMS

BACKGROUND OF THE INVENTION

1. Field of the Invention

The present invention relates to a method and apparatus for forming a thin film on a substrate, and more particularly to a method and apparatus for forming a desired thin film on a substrate by using a chemical vapor deposition (i.e., CVD) process.

2. Description of the Related Art

In manufacturing a semiconductor device typified by LSI devices (i.e., Large Scale Integrated circuits), memories, microprocessors and like devices, it is necessary to form various types of thin films on the same substrate of a semiconductor. In general, these thin films comprise various types of insulation films and conductive films. The insulation films comprise: a silicon nitride (i.e., $Si_3N_4$) film serving as an oxidation-resistant mask film used in forming a dielectric isolation film in an LSI device of MOS (i.e., Metal Oxide Semiconductor) type; and, an insulation film formed of a silicon oxide film, which serves as a surface protection film or the like. On the other hand, as for the above-mentioned conductive films, they comprise: a polysilicon film serving as gate wirings, or the like ; and, a tungsten film serving as contact plugs or the like in realizing a so-called multilevel interconnection or metallization.

As a method for forming the above-mentioned thin films, heretofore widely used is an LPCVD (i.e., Low Pressure Chemical Vapor Deposition) process. In this LPCVD process, a reactor furnace having received a semiconductor substrate (which is a workpiece) is reduced in pressure in its atmosphere. Under such a reduced pressure in the atmosphere of the reactor furnace, a reactant gas is introduced into the reactor furnace to form a desired thin film on the workpiece or semiconductor substrate. In comparison with an NPCVD (i.e., Normal Pressure Chemical Vapor Deposition) process, the LPCVD process is superior to the NPCVD process in that: the former process is less in consumption of the reactant gas than the latter process; the former process may form the thin film at a relatively low temperature, which is lower than that used in the latter process; and, the former process is superior to the latter process in uniformity of film thickness of its product (i.e., thin film) or in covering properties of the thus formed thin film.

Further, as for an LPCVD unit used in the LPCVD process, though a horizontal type of the LPCVD unit was employed during the early stages, recently a vertical type of the LPCVD unit has been widely employed since the vertical type is improved: in easiness in control of the reactant gas in flow; in uniformity of heating the reactant gas; and, efficiency in chemical reaction of the reactant gas, in comparison with the horizontal type.

Now, a conventional method for forming a thin film will be described with reference to an example, in which a thin film is formed of a silicon nitride film serving as a major insulation film in the semiconductor device.

First, the LPCVD unit provided with a vertical type of a reactor furnace is arranged, wherein its reactor tube is made of quartz (i.e., $SiO_2$). In the LPCVD process, the interior of this reactor tube is heated, and kept at a temperature of approximately 760° C., which is equal to a film-forming temperature of the silicon nitride film. Then, a jig carrying thereon a set of semiconductor substrates (which are workpieces) on each of which a thin film should be formed is loaded into the reactor furnace. After that, a plurality of reactant gases, for example such as dichlorosilane (i.e., $SiH_2Cl_2$) gas and ammonia (i.e., $NH_3$) gas are introduced into the reactor tube to react with each other, so that a thin film, i.e., silicon nitride film is formed on each of the semiconductor substrates. Such film-forming process for forming the silicon nitride film on each of the semiconductor substrates is performed for a predetermined period of time, so that a desired silicon nitride film with a necessary film thickness is formed on each of the semiconductor substrates. After completion of formation of the desired silicon nitride film on each of the semiconductor substrates, the supply of the reactant gases is stopped to take out the jig from the reactor furnace. After the jig is taken out of the reactor furnace, then, the whole cycle in the above film-forming process is repeated with respect to a next new set of semiconductor substrates, which are carried out on another jig or the jig previously used and are loaded into the reactor tube together with the jig.

On the other hand, in the film-forming process described above, the silicon nitride film is formed not only on the surface of each of the semiconductor substrates but also on the surfaces of other members disposed inside the reactor furnace, for example such as an inner wall of the reactor tube, jig, and like members all disposed inside the reactor tube. The silicon nitride film formed on each of these members other than the semiconductor substrates forms an unnecessary thin film, formation of which is inevitable in any reactor furnace. Further, such unnecessary thin film or unnecessary silicon nitride film is accumulated to increase its film thickness particularly in the inner wall of the reactor tube when a plurality of the film-forming processes are performed in the same reactor tube. The unnecessary silicon nitride film thus accumulated on the reactor tube made of quartz differs in coefficient of thermal expansion from its substrate made of quartz, and is therefore subjected to stress due to the presence of a difference in thermal expansion coefficient, wherein the stress gradually increases as the film thickness of the unnecessary silicon nitride film increases due to its accumulation through the plurality of the film-forming processes.

FIG. 17 shows a longitudinal sectional view of an essential part of the reactor furnace, illustrating the above phenomenon. In FIG. 17, for example, when the accumulated film thickness of the unnecessary silicon nitride film 53 formed on each of an outer tube 51, inner tube 52 and like members disposed inside the reactor furnace exceeds a predetermined value, the unnecessary silicon nitride film 53 cracks of its self due to its own stress to produce a crack 54 together with contaminant particles 55 (i.e., fragments of the unnecessary silicon nitride film 53 itself), as shown in FIG. 18. These contaminant particles 55 thus produced are naturally scattered, and fall on the surface of each of the semiconductor substrates to cause each of the semiconductor substrates to suffer from contamination (i.e., fall-on defects deposited on each of the semiconductor substrates). FIG. 19 is a plan view of the surface of the semiconductor substrate 56 formed by the conventional method for forming the thin film, illustrating the contaminant particles 55 which are scattered from the unnecessary silicon nitride film 53 and now deposited on the surface of the semiconductor substrate. Each of the contaminant particles 55 shown in FIG. 19 has a diameter of equal to or more than 200 nm. As is clear from FIG. 19, the contaminant particles 55 thus scattered and deposited on the surface of the semiconductor substrate 56 are concentrated in a peripheral area of the semiconductor substrate 56. This is because the peripheral area of the semiconductor substrate 56 is disposed in the vicinity of the inner tube 52 of the reactor furnace.

FIG. 20 is a graph showing the relationship between: the batch process numbers (in the x-axis, i.e., abscissa); and, each of the number of contaminant particles (in the left-hand y-axis, i.e., ordinate) and the accumulated film thickness of the unnecessary thin film (in the right-hand y-axis, i.e., ordinate), according to the conventional method for forming the thin films.

In FIG. 20: the reference letter "A" denotes the accumulated film thickness of the unnecessary thin film; "B" denotes the number of the contaminant particles; and, the reference letters "a", "b" and "c" denote an upper (i.e., top), an intermediate (i.e., center) and a lower area of the reactor furnace, respectively.

As is clear from FIG. 20, the accumulated film thickness of the unnecessary thin film linearly increases in proportion to the batch process numbers. Further, the number of the contaminant particles falling on the surface of the semiconductor substrate steeply increases in the 7th batch process. This tendency is true not only in this 7th batch process but also in the other batch processes subsequent to the 7th batch process. This is because, as described above, the accumulated film thickness of the unnecessary silicon nitride film reaches a predetermined value so that the stress produced in the unnecessary silicon nitride film exceeds a critical point.

As a result, due to the presence of the contaminant particles causing the fall-on defects of the semiconductor substrate, a desired silicon nitride film deposited on the semiconductor substrate is impaired in quality. Further, in maintenance which is heretofore done in the prior art, when the number of the contaminant particles increases, the reactor furnace is disassembled to do the maintenance, in which the furnace's constituent elements such as the outer tube, inner tube and the other elements are subjected to washing treatments. Consequently, in the prior art, it is necessary to do the maintenance at relatively short time intervals. In general, doing such maintenance (i.e., a series of maintenance jobs) takes substantially a whole day, during which it is necessary for the reactor furnace to be out of action. Thus, it is apparent that a need exists in the art for doing the maintenance jobs at much more prolonged time intervals than that of the prior art.

A thin film forming apparatus, in which the contaminant particles of the above-mentioned unnecessary silicon nitride film thus formed are prevented from affecting the properties of a desired thin film formed on the substrate, is disclosed in the prior art, for example such as Japanese Laid-Open Patent Application No. Hei 7-263370, in which: production of the contaminant particles is prevented by fabricating both the reactor tube and the jig for carrying thereon the workpieces (i.e., substrates) from a material having the same thermal expansion coefficient as that of the unnecessary silicon nitride film.

However, in a method for forming a desired thin film by using the above-mentioned film forming apparatus, it is necessary to arrange both the reactor tube and the jig each made of the material having the same thermal expansion coefficient as that of the unnecessary silicon nitride film, which raises the manufacturing cost due to the necessity of employing a special material in each of the reactor tube and the jig. Further, even when both the reactor tube and the jig for carrying thereon the substrates are made of the material having the same thermal expansion coefficient as that of the unnecessary silicon nitride film, it is recognized that a large number of contaminant particles are produced when the film thickness of the unnecessary silicon nitride film thus formed inside the reactor furnace exceeds approximately 2500 nm, which is slightly larger than the film thickness of the unnecessary silicon nitride film formed in the prior art.

Further, another method for forming the desired thin film without producing the contaminant particles is disclosed in the prior art, for example such as Japanese Laid-Open Patent Application No. Hei8-45859, in which: various types of desired thin films are formed by loading the workpiece (i.e., semiconductor substrate) into the reactor tube at a velocity of equal to or less than 20 mm/min, wherein the reactor tube is kept at a temperature of equal to or less than 60° C.

In the conventional method disclosed in the Japanese Laid-Open Patent Application No.Hei8-45859, only described are the conditions in loading the semiconductor substrate into the reactor tube. In other words, there is no description as to means for preventing the contaminant particles from being produced when the unnecessary thin film is formed inside the reactor tube in a condition in which the semiconductor substrate has been loaded into the reactor tube. Consequently, also in this conventional method, the problem of the production of contaminant particles in forming the desired thin film remains unsolved.

SUMMARY OF THE INVENTION

It is an object of the present invention to provide a method and apparatus for forming a desired thin film on a substrate without producing any contaminant particles deriving from an unnecessary thin film when the desired thin film is formed on the substrate.

According to a first aspect of the present invention, there is provided a method for forming a desired thin film on a substrate having been loaded into a reactor furnace of a chemical vapor deposition unit into which a reactant gas is introduced, comprising the steps of:

forming the desired thin film on the substrate;

relieving at least an unnecessary thin film from stress, the unnecessary thin film being formed on a wall of the reactor furnace; and covering the unnecessary thin film thus relieved from stress with a repair film.

In the foregoing, a preferable mode is one wherein relief of the unnecessary thin film from the stress is provided after the substrate is unloaded from the reactor furnace, on which substrate the desired thin film has been formed.

Also, a preferable mode is one wherein relief of the unnecessary thin film from the stress is provided by intentionally cracking the unnecessary thin film.

Also, a preferable mode is one wherein means for intentionally cracking the unnecessary thin film is realized by changing in temperature the interior of the reactor furnace from a film-forming temperature of the desired thin film to another temperature other than the film-forming temperature after completion of formation of the desired thin film.

Also, a preferable mode is one wherein the unnecessary thin film is covered with the repair film at another temperature other than the film-forming temperature of the desired thin film.

Also, a preferable mode is one wherein the temperature other than the film-forming temperature of the desired thin film is lower than the film-forming temperature.

Also, a preferable mode is one wherein another temperature other than the film-forming temperature of the desired thin film is higher than the film-forming temperature.

Also, a preferable mode is one wherein, after the unnecessary thin film is covered with the repair film, a new substrate on which a desired thin film should be formed is loaded into the reactor furnace, and the desired thin film is formed on the new substrate.

According to a second aspect of the present invention, there is provided a method for forming a desired thin film on a substrate having been loaded into a reactor furnace of a chemical vapor deposition unit into which a reactant gas is introduced, comprising the steps of:

forming the desired thin film on the substrate;

relieving at least an unnecessary thin film from stress by lowering in temperature the interior of the reactor furnace from a film-forming temperature of the desired thin film to another temperature lower than the film-forming temperature, wherein the unnecessary thin film is formed on a wall of the reactor furnace when the desired thin film is formed; and forming a repair film to cover the unnecessary thin film therewith at the another temperature lower than the film-forming temperature of the desired thin film.

In the foregoing second aspect, a preferable mode is one wherein, after completion of the step of forming the desired thin film on the substrate, the substrate on which the desired thin film has been formed is unloaded from the reactor furnace.

Also, a preferable mode is one wherein, after completion of the step of forming the desired thin film on the substrate, a new substrate on which a desired thin film should be formed is loaded into the reactor furnace so that the desired thin film is formed on the new substrate.

Also, a preferable mode is one wherein the reactor furnace is formed of quartz; and, each of the desired thin film, the unnecessary thin film and the repair film is formed of silicon nitride film.

Also, a preferable mode is one wherein the step of relieving the unnecessary thin film formed of silicon nitride film from the stress is performed by intentionally cracking the unnecessary thin film.

According to a third aspect of the present invention, there is provided an apparatus for forming a desired thin film, comprising:

a reactor furnace for receiving therein a substrate on which the desired thin film should be formed;

wherein a reactant gas is introduced into the reactor furnace which has its interior kept at a film-forming temperature of the desired thin film to form the desired thin film on the substrate;

wherein, after completion of formation of the desired thin film on the substrate, a reactor tube forming a part of the reactor furnace is taken out of the reactor furnace.

Also, a preferable mode is one wherein the reactor tube is constructed of an inner tube into which the substrate is loaded.

As described above, with the method and apparatus of the present invention for forming the desired thin films, after a plurality of thin-film forming processes are performed in the same reactor furnace, and, before the unnecessary thin film thus accumulated through the above thin-film forming processes in the same reactor furnace cracks of itself to produce the contaminant particles, the unnecessary thin film is changed in temperature from its film-forming temperature to another temperature other than the film-forming temperature to intentionally cause this unnecessary thin film to crack, so that the thus cracked unnecessary thin film is relieved from its stress. After completion of such stress relief of the unnecessary thin film, the thus cracked unnecessary thin film is covered with another thin film serving as a repair film. Consequently, it is possible for the present invention to stabilize the unnecessary thin film in properties.

As a result, it is possible for the present invention to prevent the unnecessary thin film from producing the contaminant particles in forming the desired thin film in the LPCVD unit.

Further, in the present invention, as described above, the unnecessary thin film is previously subjected to the intentional stress to crack and then covered with the repair film, which permits the user to do maintenance jobs at much more prolonged time intervals than that of the prior art.

BRIEF DESCRIPTION OF THE DRAWINGS

The above and other objects, advantages and features of the present invention will be more apparent from the following description taken in conjunction with the accompanying drawings in which.

DETAILED DESCRIPTION OF THE PREFERRED EMBODIMENTS

The best modes for carrying out the present invention will be described in detail using embodiments of the present invention with reference to the accompanying drawings.

First Embodiment

FIGS. 1 to 4 show, step by step, a first embodiment of a method of the present invention for forming a desired thin film on a substrate. Now, with reference to FIGS. 1 to 5, the first embodiment of the method of the present invention will be described.

Figure 1:
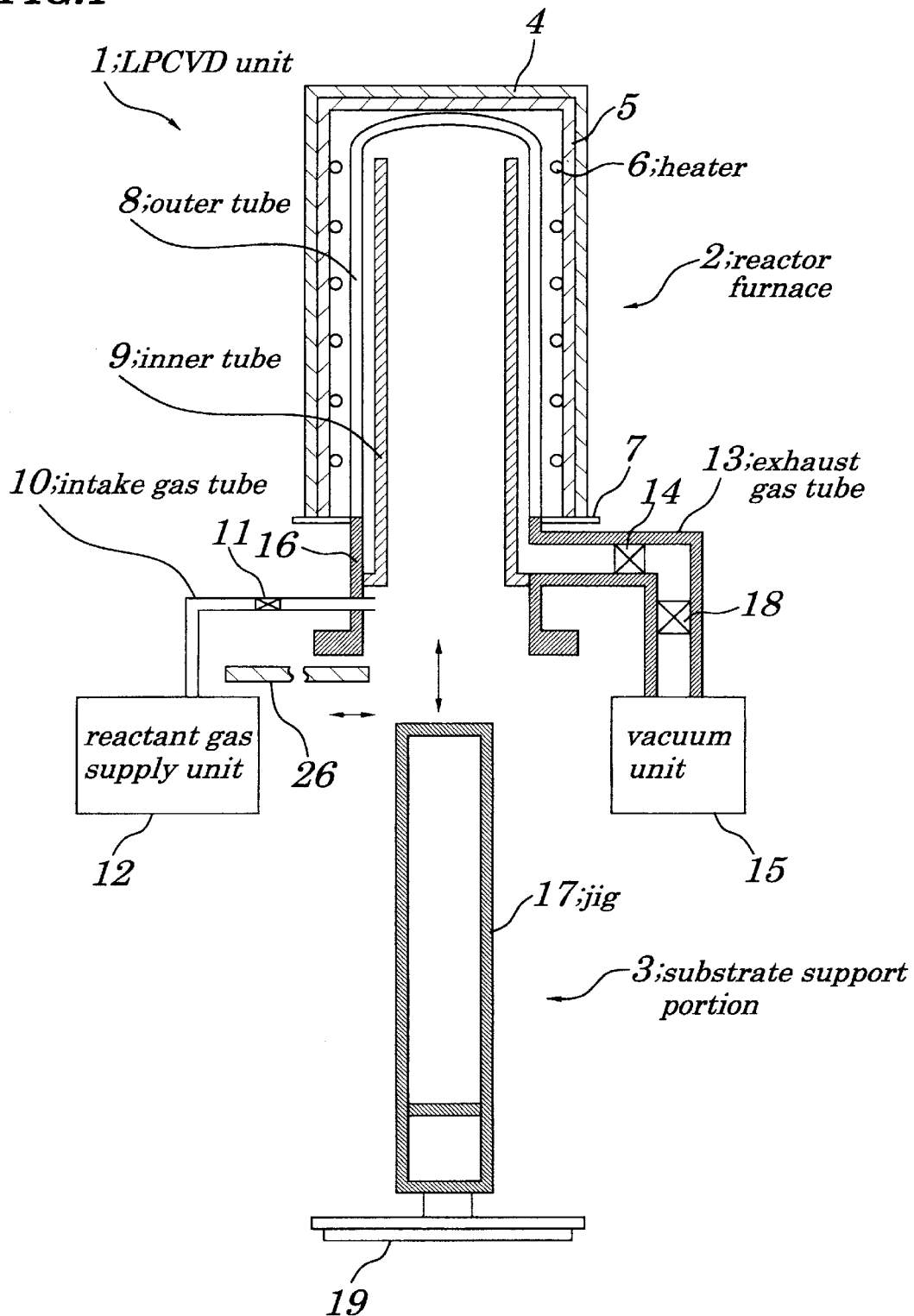
FIG. 1 is a longitudinal sectional view of a low pressure chemical vapor deposition (i.e., LPCVD) unit, illustrating a method of a first embodiment of the present invention for forming the desired thin film.

First, as shown in FIG. 1, an LPCVD (i.e., Low Pressure Chemical Vapor Deposition) unit 1 provided with a vertical furnace is arranged. This LPCVD unit 1 is constructed of a vertical type reactor furnace 2 and a substrate support portion 3, which is capable of moving up and down relative to the reactor furnace 2 so as to be loaded into and unloaded from the reactor furnace 2. On the other hand, the reactor furnace 2 is constructed of a cylindrical casing 4, which is open at its lower end to the outside and closed at its upper end. Fixedly mounted inside the cylindrical casing 4 is a heat insulating member 5 through which a heater 6 is mounted on the cylindrical casing 4. The lower end portion of the cylindrical casing 4 is supported by a plate member 7. Disposed further inside the heat insulating member 5 is an outer tube 8, which is made of quartz and fixedly mounted on a manifold portion 16 of the LPCVD unit 1. Disposed still further inside the outer tube 8 is an inner tube 9, which is coaxially disposed with the outer tube 8, made of quartz and has its lower portion supported by the manifold portion 16 of the LPCVD unit 1. These outer tube 8 and the inner tube 9 form an essential part of the reactor furnace 4. Here, as will be described later, after completion of formation of the desired thin film, the inner tube 9 is dismounted from the manifold portion 16, and unloaded from the reactor furnace 2 to the outside.

An intake gas supply tube 10 has one of its opposite ends fixedly mounted on an outer peripheral portion of the manifold portion 16 of the LPCVD unit 1, and the other of its opposite ends connected with a reactant gas supply unit 12 through a valve 11. Further provided in the outer peripheral portion of the manifold portion 16 is an exhaust gas tube 13, which is shown in FIG. 1 so as to be oppositely disposed from the intake gas tube 10. The exhaust gas tube 13 having one of its opposite ends fixedly mounted on the outer peripheral portion of the manifold portion 16 has the other of its opposite ends connected with a vacuum unit 15 through a valve 14. Further provided in the exhaust gas tube 13 between the valve 14 and the vacuum unit 15 is a pressure control valve 18. On the other hand, provided on a bottom portion of the reactor furnace 2 is a shutter member 26 for opening and closing the lower end opening of the reactor furnace 2.

Figure 2A:
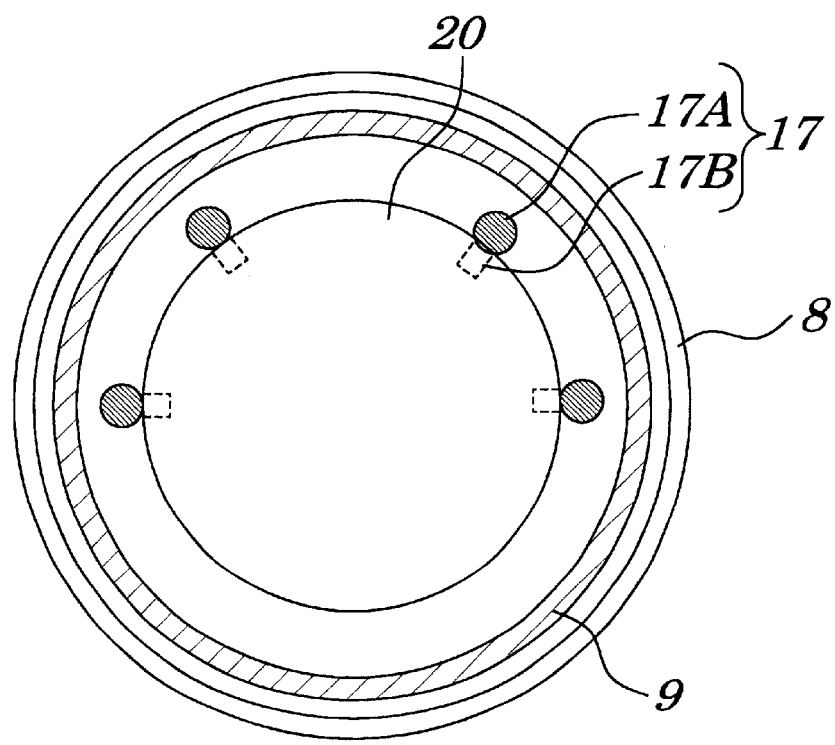
FIG. 2A is a cross-sectional view of the outer tube of the LPCVD unit shown in FIG. 1, illustrating the method of the first embodiment of the present invention for forming the desired thin film.
Figure 2B:
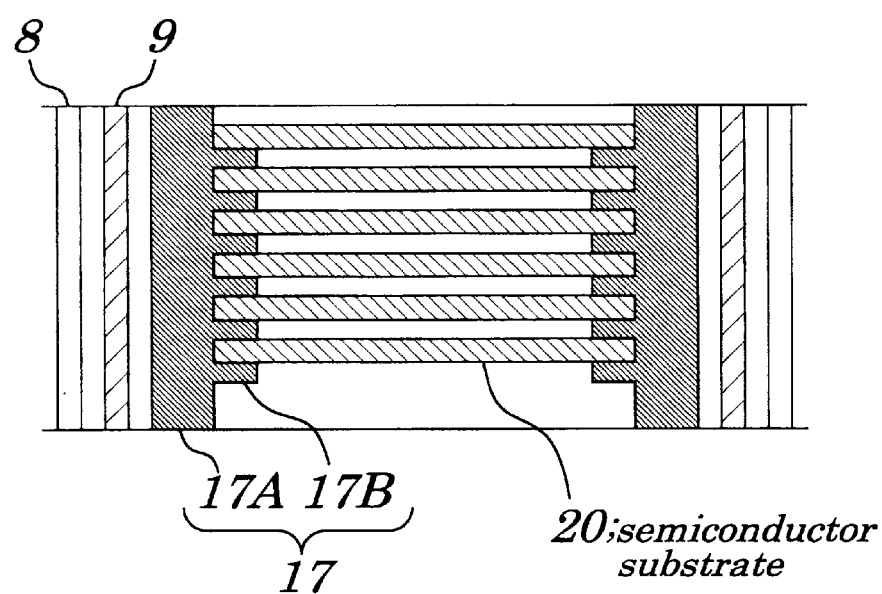
FIG. 2B is a longitudinal sectional view of the jig loaded into the inner tube of the LPCVD unit shown in FIG. 1, illustrating the method of the first embodiment of the present invention for forming the desired thin film.

On the other hand, in the substrate support portion 3, a set of workpieces (i.e., semiconductor substrates) 20 are vertically stacked into a neat pile inside a jig 17 which is mounted on a base platform 19. This jig 17 is moved up and down by means of an elevator unit (not shown) which is housed in the base platform 19. As shown in FIGS. 2A and 2B, the jig 17 is constructed of a plurality of column elements 17A each of which is provided with a support segment 17B in its inner side. In operation, when the substrate support portion 3 is loaded into the reactor furnace 2, the set of the semiconductor substrates 20 are supported by these support segments 17B during this loading operation. FIG. 1 shows in cross section the substrate support portion 3 having been unloaded from the reactor furnace 2.

Figure 3:
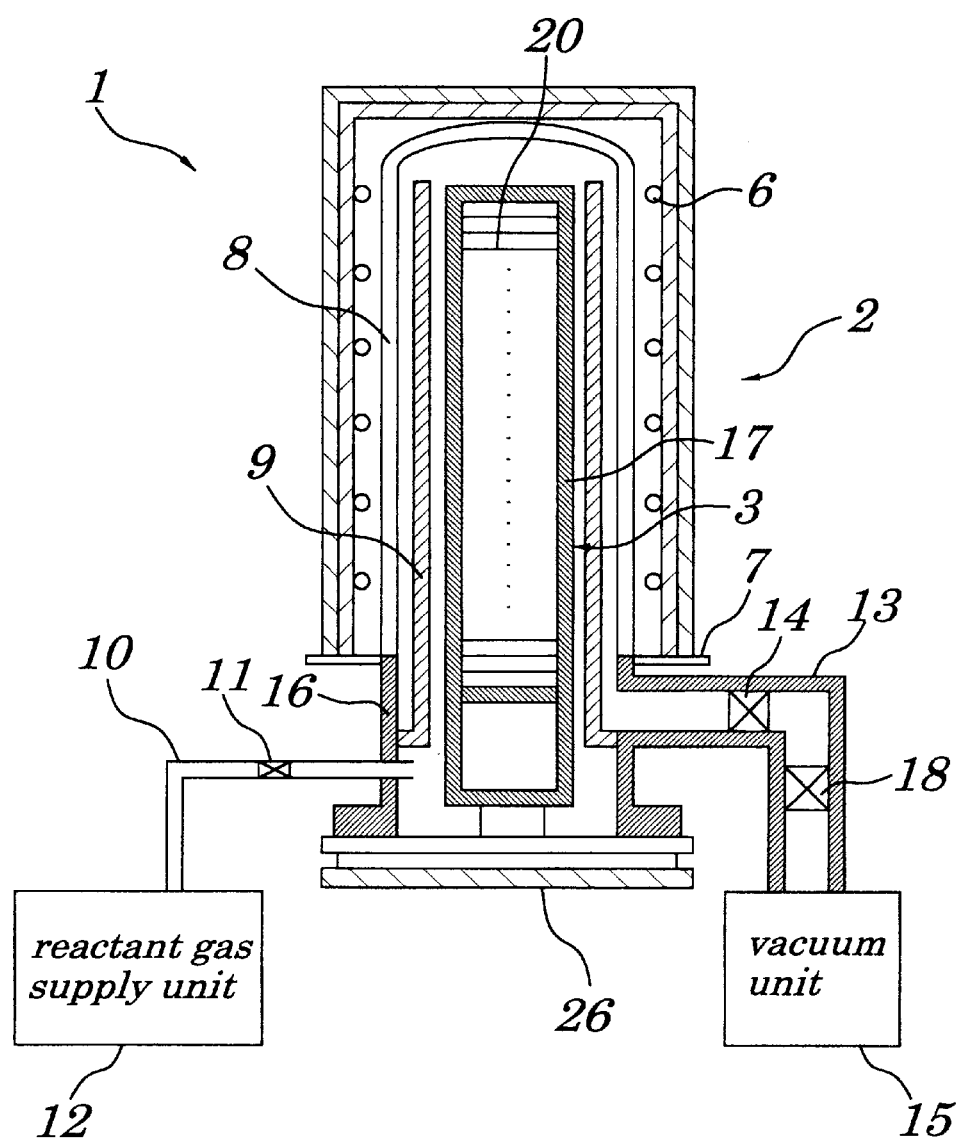
FIG. 3 is a longitudinal view of the LPCVD unit of FIG. 1, illustrating the jig loaded into the LPCVD unit as a whole.

In operation, a space defined by the outer tube 8 and the inner tube 9 of the reactor furnace 2 is previously heated by the heater mounted inside the reactor furnace 2 shown in FIG. 1 up to approximately 760° C. which is equal to a film-forming temperature of a desired silicon nitride film. Then, a set of the semiconductor substrates 20, on each of which a desired thin film or desired silicon nitride film is formed, are loaded into the jig 17 of the substrate support portion 3 and supported therein by the support segments 17B. After that, as shown in FIG. 3, the jig 17 is lifted up by means of the elevator unit (not shown) housed in the base platform 19, so that the jig 17 is loaded into the inner tube 9 of the reactor furnace 2. After completion of this loading operation of the jig 17 into the inner tube 9, the substrate support portion 3 is brought into hermetically sealing contact with the reactor furnace 2.

Then, in the reactor furnace 2 of the LPCVD unit 1 shown in FIG. 3, both the valve 14 and the pressure control valve 18 are opened to control or reduce pressure in the interior of the reactor furnace 2 to a vacuum of from 30 to 80 Pa (i.e., Pascal). Subsequent to the above, it is judged as to whether or not the reactor furnace 2 causes leakage of gases. In the case that there is no leakage of gases in the reactor furnace 2, the semiconductor substrates 20 having been loaded in the reactor furnace 2 are stabilized in temperature.

After that, the valve 11 is opened. As a result, dichlorosilane (i.e., $SiH_2Cl_2$) gas and ammonia (i.e., $NH_3$) gas are supplied as reactant gases through the intake gas tube 10 from the reactant gas supply unit 12 to the reactor furnace 2 at flow rates of from 10 to 100 sccm (i.e., standard cubic centimeter per minute) and of from 100 to 1000 sccm, respectively. These reactant gases react with each other to form a desired silicon nitride film on each of the semiconductor substrates 20.

Figure 5:
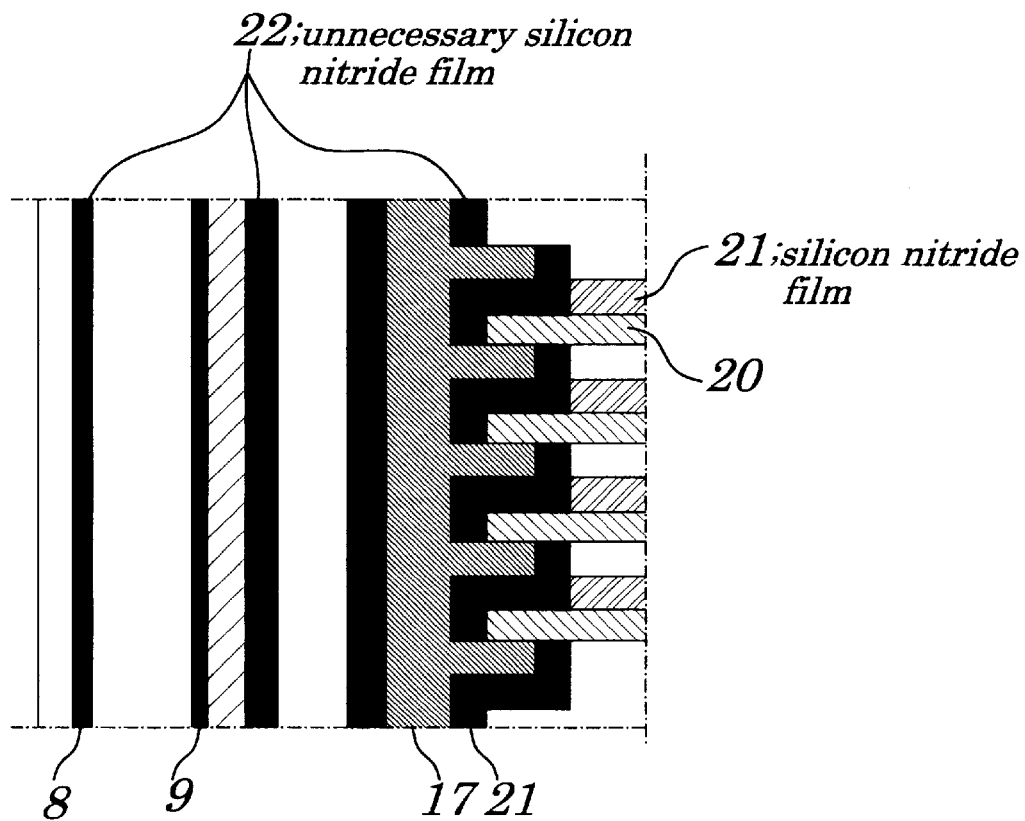
FIG. 5 is an enlarged longitudinal sectional view of an essential part of the LPCVD unit in which the jig has been received in the inner tube of the LPCVD unit.

Under the above-mentioned film-forming conditions, a film-forming process is conducted for approximately 50 minutes, which results in a desired thin film, i.e., desired silicon nitride film 21 (shown in FIG. 5) having a film thickness of approximately 100 nm (which corresponds to a film-forming rate of from approximately 2 to approximately 3 nm/min) formed on each of the semiconductor substrates 20. As is clear from the above, it is possible to control in film thickness the desired silicon nitride film 21 by controlling the film-forming process in its reaction period of time. As shown in FIG. 5, when the desired thin film, i.e., desired silicon nitride film 21 is formed on each of the semiconductor substrates 20, also formed on each of walls of the outer tube 8, inner tube 9, jig 17 and like members subjected to the reactant gases is an unnecessary thin film, i.e., unnecessary silicon nitride film 22. The film thickness of this unnecessary silicon nitride film 22 is prone to increase in an inner wall of the inner tube 9 and the surface of the jig 17 both disposed adjacent to major flow routes of the reactant gases.

Figure 4:
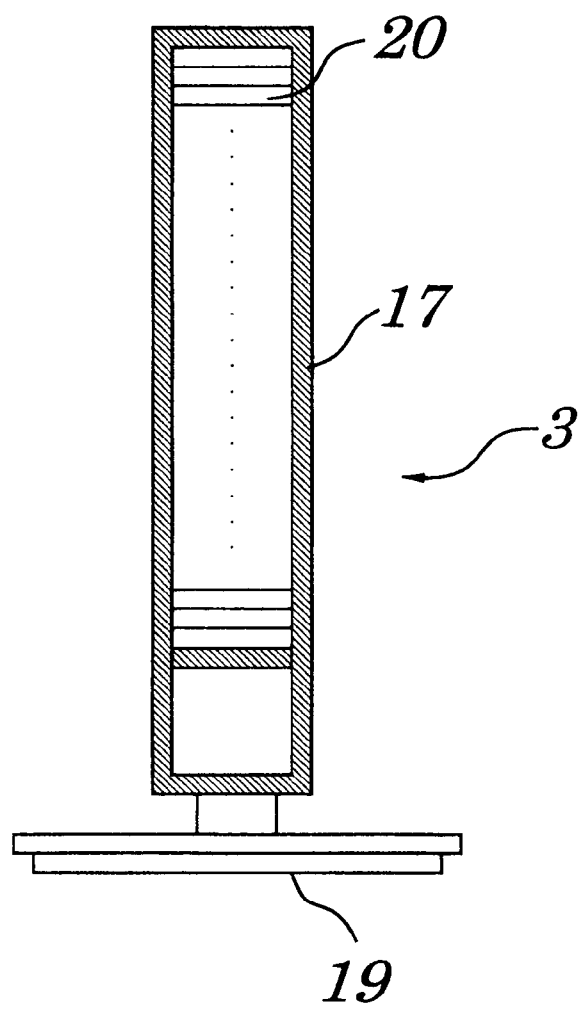
FIG. 4 is a longitudinal sectional view of the jig used in the method of the first embodiment of the present invention.

As shown in FIGS. 3 and 5, after completion of formation of the desired silicon nitride film 21 on each of the semiconductor substrates 20, the supply of the reactant gases through the intake gas tube 10 is stopped. Then, the reactant gases used in the current film-forming process are expelled from the interior of the reactor furnace 2. After that, the interior of the reactor furnace 2 is returned to the atmospheric pressure. Then, as shown in FIG. 4, the jig 17 is moved down, i.e., unloaded from the reactor furnace 2, so that the film-forming process corresponding to the first batch process is finished.

In each of a series of batch processes subsequent to the above first batch process, for example such as the second batch process subsequent to the first batch process, a new set of semiconductor substrates 20 are loaded into another one of jigs 17 or the jig 17 previously used. Then, the same process steps as those of the first batch process are repeated under the same conditions as that of the first batch process. The more the number of the batch processes increase, the more the film thickness of the unnecessary silicon nitride film 22 increases due to accumulation of the unnecessary silicon nitride films repeatedly formed on the same members such as the walls of the inner tube 9, outer tube 8, jig 17 and of like members in these batch processes. On the other hand, in the unnecessary silicon nitride film 22, the more its film thickness increases each time the batch process is conducted, the more its stress increases stepwise.

In the first embodiment of the present invention, after completion of the ninth batch process, the tenth batch process is performed. After completion of this tenth batch process, the jig 17 is unloaded from the reactor furnace 2. Then, the eleventh batch process is conducted, wherein a process step for eliminating the thus increased stress of the unnecessary silicon nitride film 22 formed on the inner tube 9 and like members is conducted. This process step will be hereinbelow referred to as the stress eliminating step. This stress eliminating step is performed in accordance with a temperature control schedule (i.e., graph shown in FIG. 6) in a condition in which the jig 17 has been unloaded from the reactor furnace 2.

Figure 6:
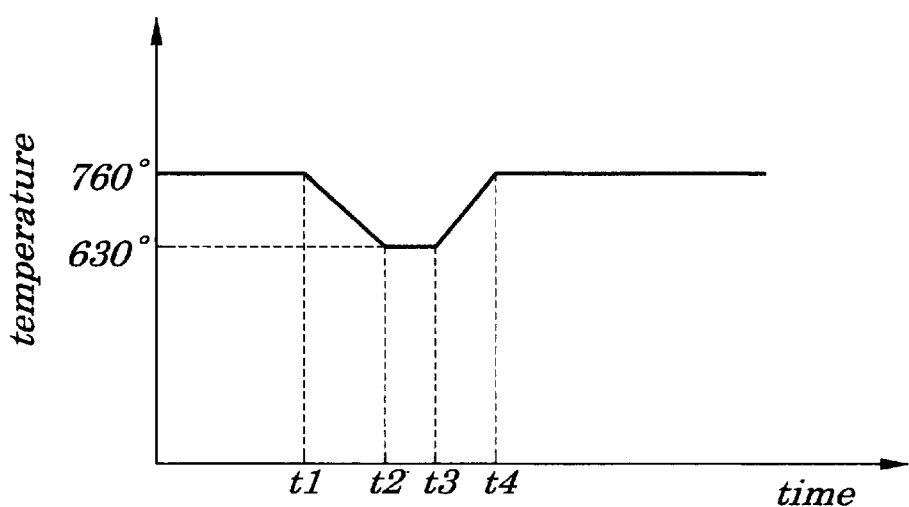
FIG. 6 is a graph showing a time schedule in a stress relief process performed in the method of the first embodiment of the present invention.

In this stress eliminating process step, first of all, in a condition in which the reactor furnace 2 is closed by means of the shutter member 26 (FIGS. 1 and 5), the unnecessary silicon nitride film 22 formed inside the reactor furnace 2 and kept therein at a temperature of approximately 760° C. is reduced in temperature to approximately 630° C. during a time period of from t1 to t2 (FIG. 6). A temperature-reducing process for reducing the temperature of the unnecessary silicon nitride film 22 is performed for a time period of from 20 to 40 minutes at a temperature reducing rate of from 3 to 5° C./minute by controlling the heater 6. It is also possible to perform this temperature-reducing process by taking out the inner tube 9 from the outer tube 8 to rapidly cool the inner tube 9, because the inner tube 9 is capable of being taken out of the outer tube 8 in construction. When the inner tube 9 is taken out of the outer tube 8, the inner tube 9 is rapidly cooled to a sufficiently lower temperature in a few minutes. Consequently, in this case, it is possible to considerably reduce a time period required for reducing in temperature the unnecessary silicon nitride film 22 to the sufficiently lower value.

Figure 7:
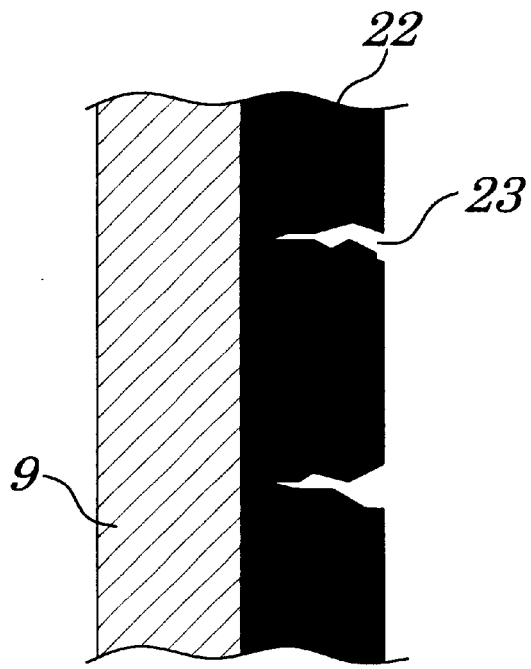
FIG. 7 is an enlarged sectional view of a part of the inner tube of the LPCVD unit shown in FIG. 1, illustrating the cracks intentionally produced according to the method of the first embodiment of the present invention.

By performing the above-mentioned temperature-reducing process, as shown in FIG. 7, it is possible to forcibly or intentionally crack the unnecessary silicon nitride film 22 having been formed and accumulated on the walls of the inner tube 9 and of like members up to the tenth batch process. As is clear from the above, it is possible to relieve the unnecessary silicon nitride film 22 from its accumulated stress by intentionally cracking the unnecessary silicon nitride film 22 before it cracks of itself at a time when its film thickness reaches a predetermined value and its accumulated stress exceeds a critical point.

Figure 8:
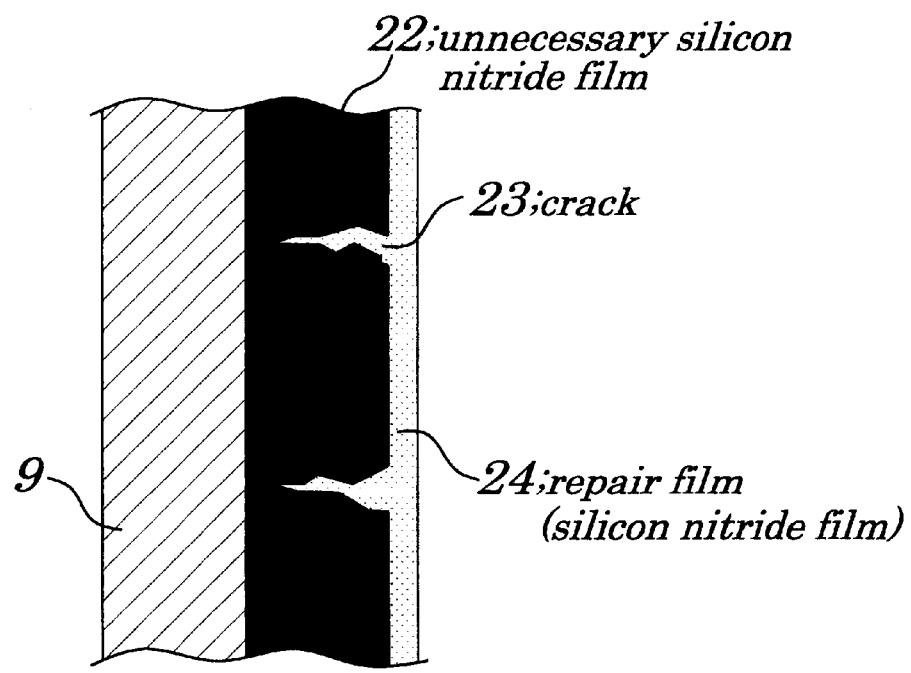
FIG. 8 is an enlarged sectional view of the part of the inner tube of the LPCVD unit shown in FIG. 1, illustrating the repair film which covers the cracks of the unnecessary thin film shown in FIG. 7.

Next, at the thus reduced temperature of approximately 630° C., the valve 11 is opened for a time period of from t2 to t3, as shown in FIG. 6. As a result, the reactant gases are supplied through the intake gas tube 10 from the reactant gas supply unit 12 to the interior of the reactor furnace 2, so that a new silicon nitride film serving as a repair film 24 having a film thickness of from 5 to 6 nm is formed on the thus cracked and therefore unstable unnecessary silicon nitride film 22 to cover this unnecessary silicon nitride film 22, as shown in FIG. 8. In the above, formation of the repair film 24 is conducted at a film forming rate of from 0.2 to 0.5 nm/minutes for a time period of from 10 to 20 minutes. As a result, all the intentionally produced cracks 23 of the unnecessary silicon nitride film 22 are filled with this repair film 24, so that the thus cracked unnecessary silicon nitride film 22 is stabilized in properties, whereby any contaminant particles are prevented from being produced from the unnecessary silicon nitride film 22 thus stabilized in properties.

Here, it should be noted that, by exclusively using the reactor furnace 2, the above-mentioned stress eliminating process may be conducted in parallel with a next loading operation of a new set of semiconductor substrates 20 into another jig 17 or the jig 17 having been unloaded from the reactor furnace 2. In other words, it is possible to perform the stress eliminating process without extending the entire period of time required for each of the batch processes.

Then, the interior of the reactor furnace 2 is returned in temperature to the film-forming temperature of approximately 760° C. during a time period of from t3 to t4, as shown in FIG. 6. After that, the jig 17 carrying the new set of the semiconductor substrates 20 is loaded into the reactor furnace 2 so that the twelfth batch process for forming the desired thin film is performed.

Figure 9:
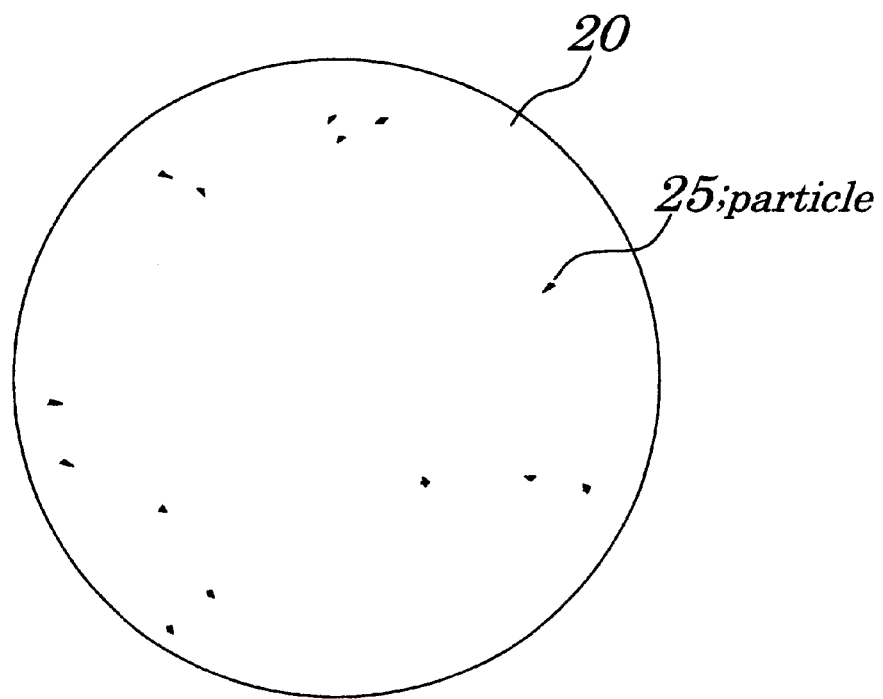
FIG. 9 is a plan view of a semiconductor substrate prepared by the method of the first embodiment of the present invention for forming the desired thin film.
Figure 10:
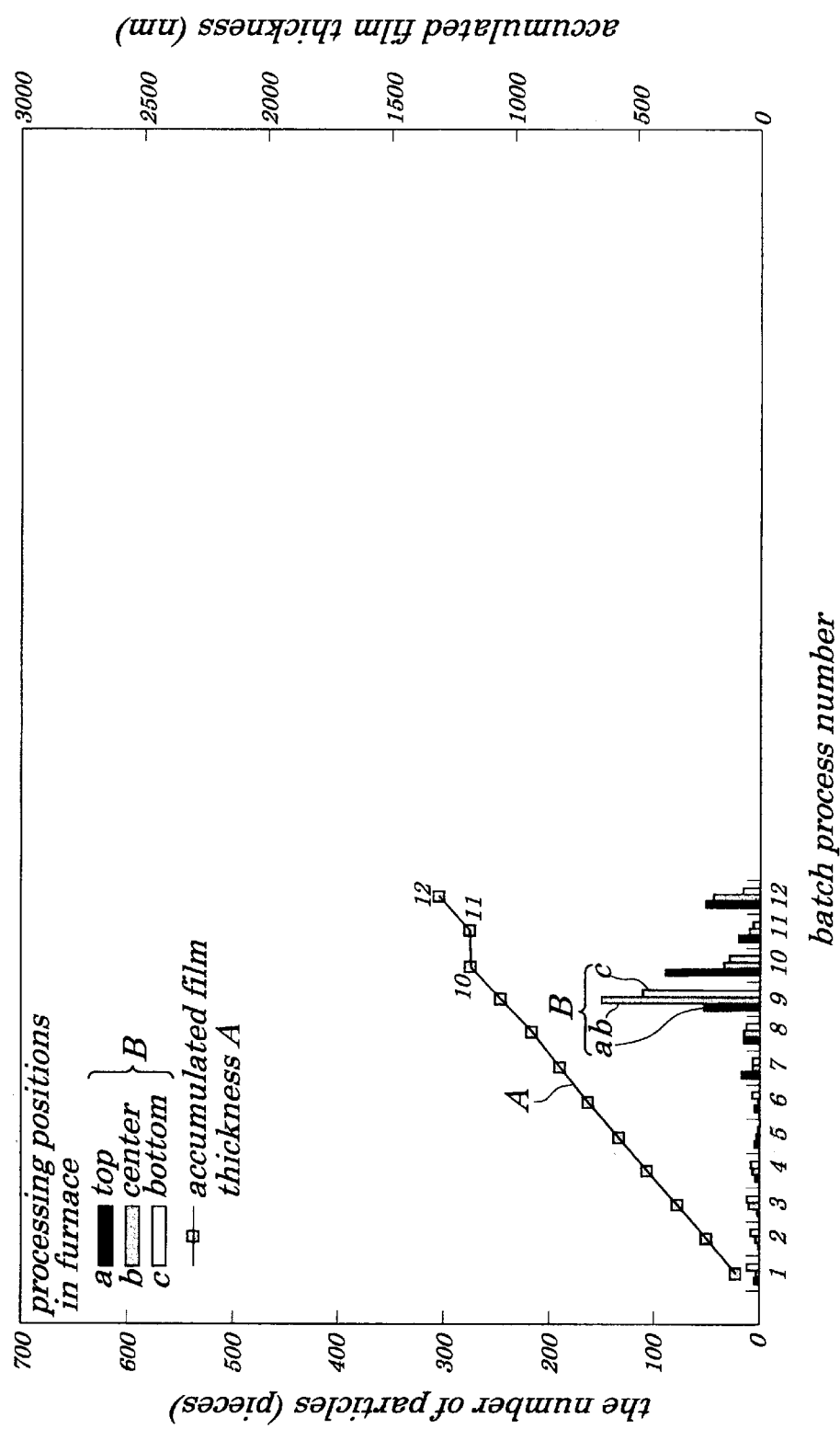
FIG. 10 is a graph showing the relationship between: the batch process numbers (in the abscissa); and, each of the number of the contaminant particles (in the left-hand ordinate) and the accumulated film thickness of the unnecessary thin film (in the right-hand ordinate), according to the method of the first embodiment of the present invention.

FIG. 10 is a graph showing the relationship between: the batch process numbers (in the abscissa); and, each of the number of the contaminant particles (in the left-hand ordinate) and the accumulated film thickness of the unnecessary thin film (in the right-hand ordinate), according to the method of the first embodiment of the present invention. In FIG. 10: the reference letter "A" denotes the accumulated film thickness of the unnecessary silicon nitride 22; the reference letter "B" denotes the number of the contaminant particles 25 (shown in FIG. 9); and, the reference letters "a", "b" and "c" denote bar graphs showing the number of the contaminant particles 25 deposited on the semiconductor substrates 20 loaded into a top (i.e., upper), an intermediate (i.e., center) and a lower area of the reactor furnace 2, respectively.

As is clear from FIG. 10, from the first to the 10th batch process, the accumulated film thickness of the unnecessary silicon nitride film 22 linearly increases. In contrast with this, between the 10th batch process and the 11th batch process, there is substantially no increase of the accumulated film thickness of the unnecessary silicon nitride film 22. Further, after completion of the 11th batch process, even when the 12th batch process is performed, the number of the contaminant particles 25 is considerably reduced. This is because the stress eliminating process step is conducted in the 11th batch process to apply the repair film 24 to the unnecessary silicon nitride film 22 to effectively cover its cracks 23 (shown in FIG. 8), and thereby preventing the contaminant particles 25 from being produced.

Figure 19:
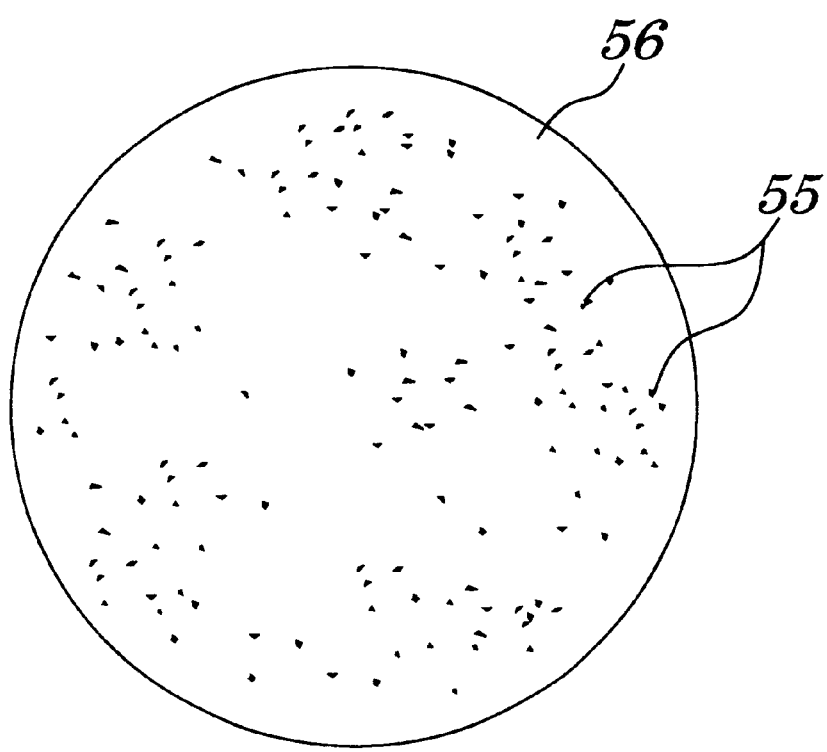
FIG. 19 is a plan view of the semiconductor substrate, illustrating its surface obtained according to the conventional method for forming the thin films.
Figure 20:
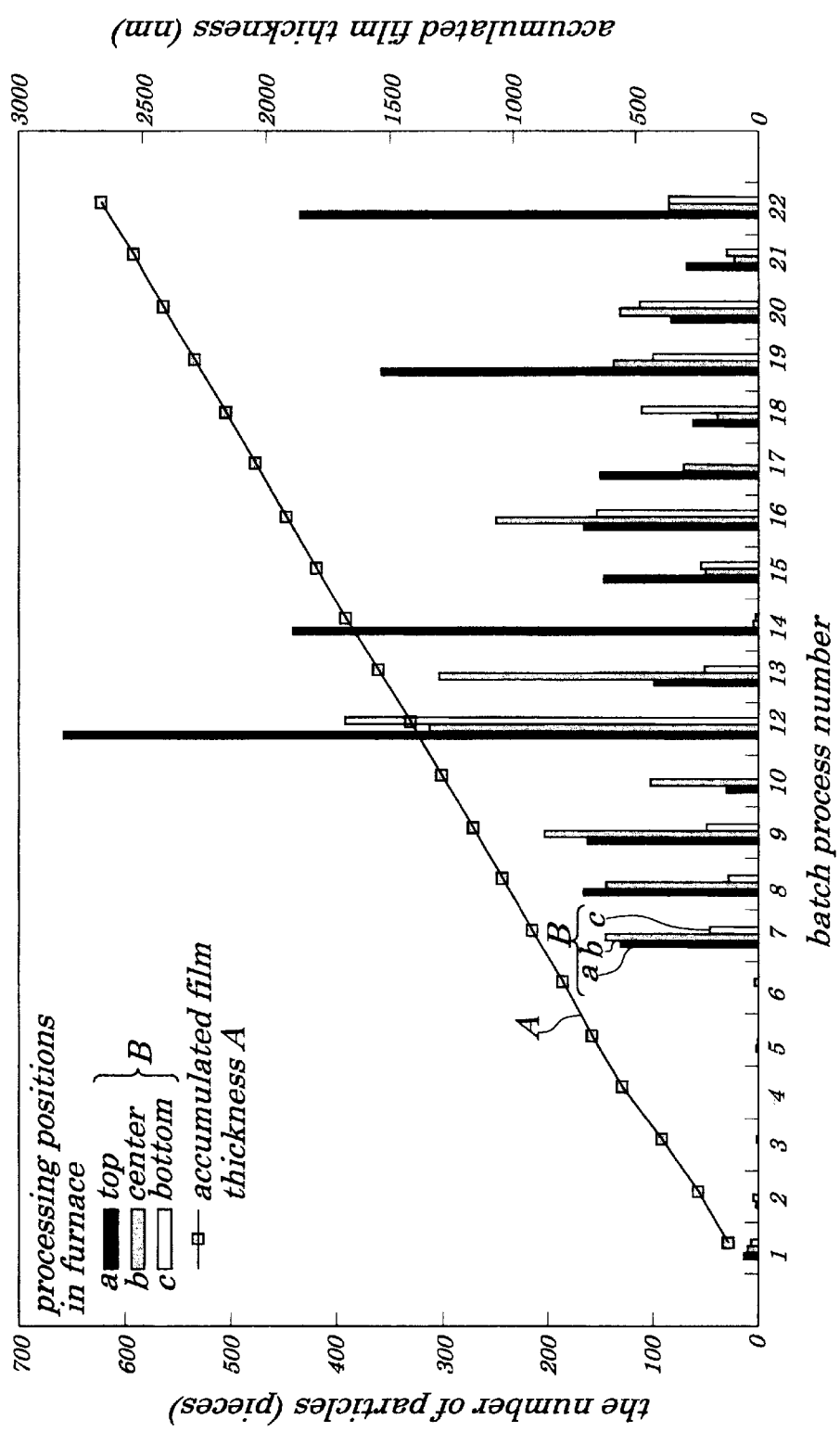
FIG. 20 is a graph showing the relationship between: the batch process numbers (in the abscissa); and, each of the number of the contaminant particles (in the left-hand ordinate) and the accumulated film thickness of the unnecessary thin film (in the right-hand ordinate), according to the conventional method for forming the desired thin film.

FIG. 9 is a plan view of the semiconductor substrate 20 obtained by the method of the first embodiment of the present invention for forming the desired thin film 21 (not shown), illustrating the contaminant particles 25 which are scattered from the unnecessary silicon nitride film 22 (not shown) and deposited on the semiconductor substrate 20 to form a so-called fall-on defects of the semiconductor substrate 20. As is clear in comparison with FIG. 19 illustrating the semiconductor substrate 56 obtained in the prior art, FIG. 9 shows the contaminant particles 25 the number of which is considerably smaller than the number of the contaminant particles 55 shown in the prior art (see FIG. 19).

As described above, in the method of the first embodiment of the present invention, after completion of a plurality of the film-forming processes of the desired silicon nitride films, and before the unnecessary silicon nitride film 22 thus accumulated in film thickness cracks of itself, the unnecessary silicon nitride film 22 is reduced in temperature from its film-forming temperature to a lower one, so that the unnecessary silicon nitride film 22 is intentionally subjected to a difference in temperature, which causes the unnecessary silicon nitride film 22 to crack to produce the cracks 23 capable of relieving the unnecessary silicon nitride film 22 from its accumulated stress. After that, the unnecessary silicon nitride film 22 thus cracked is covered with the repair film 24, and therefore stabilized in properties.

Consequently, it is possible for the first embodiment of the method of the present invention to prevent the contaminant particles 25 from being produced from the unnecessary silicon nitride film 22 thus cracked.

Further, in this first embodiment of the method of the present invention, since the unnecessary thin film (i.e., silicon nitride film 22) is covered by the repair film 24 after the stress is previously provided in the unnecessary thin film (i.e., silicon nitride film) 22 to intentionally crack the unnecessary thin film 22, it is possible to do maintenance of the LPCVD unit 1 at relatively long regular time intervals.

Second Embodiment

Figure 11:
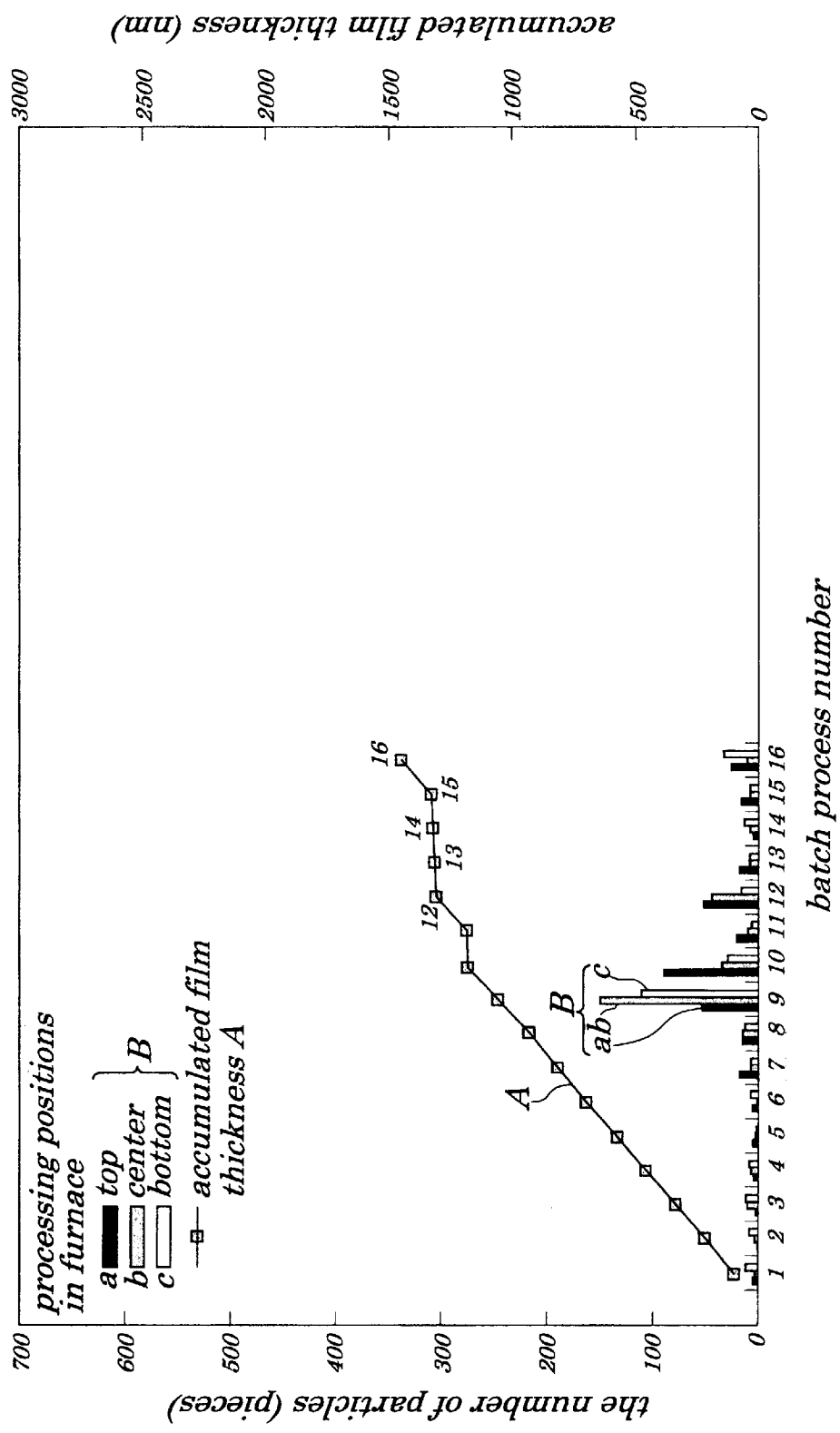
FIG. 11 is a graph showing the relationship between: the batch process numbers (in the abscissa); and, each of the number of particles (in the left-hand ordinate) and the accumulated film thickness of the unnecessary thin film (in the right-hand ordinate), according to the method of the second embodiment of the present invention.

FIG. 11 is a graph showing the relationship between: the batch process numbers (in the abscissa); and, each of the number of the contaminant particles 25 (in the left-hand ordinate) and the accumulated film thickness of the unnecessary thin film (in the right-hand ordinate), according to the method of a second embodiment of the present invention.

This second embodiment of the method of the present invention remarkably differs in construction from the first embodiment of the method of the present invention in that: it performs the stress eliminating process step once more for eliminating stress further provided in the unnecessary silicon nitride film 22 after completion of the film-forming process of the first embodiment of the method of the present invention.

In other words, after completion of the film-forming process according to the first embodiment of the method of the present invention, the jig 17 is unloaded from the reactor furnace 2 after completion of the 12th batch process for forming the desired thin film. Then, in the 13th batch process, both the stress eliminating process step and a repair-film forming process step for forming the repair film 24 to cover the unnecessary thin film (i.e., silicon nitride film 22) are conducted under the same conditions as that of the stress eliminating process step and of the repair-film forming process step both conducted in the first embodiment of the method of the present invention. After that, in the 14th batch process subsequent to the 13th batch process, another one of each of the stress eliminating process step and the repair-film forming process step is conducted under the same conditions as that described above. Then, in the 15th batch process subsequent to the 14th batch process, a further one of each of the stress eliminating process step and the repair-film forming process step is conducted under the same conditions as that described above. After that, the 16th batch process is conducted to form the desired thin film, i.e., desired silicon nitride film 21 (shown in FIG. 5) on each of the semiconductor substrates 20.

As described above, in each of the 13th, 14th and the 15th batch process, both the stress eliminating process step and the repair-film forming process step are sequentially conducted. As a result, as is clear from the graph shown in FIG. 11, there is substantially no increase of the accumulated film thickness of the unnecessary silicon nitride film 22 between the 12th and the 15th batch process. After completion of the 15th batch process, even when the 16th batch process subsequent to the 15th batch process is performed, the number of the contaminant particles 25 is considerably reduced. This is because the unnecessary silicon nitride film 22 is effectively stabilized in properties through the stress eliminating process steps conducted in each of the 13th, 14th and the 15th batch process and followed by each of the repair-film forming process steps, and thereby preventing the contaminant particles 25 from being produced therefrom.

As described above, also in this second embodiment of the method of the present invention, it is possible to obtain substantially the same effect as that obtained in the first embodiment of the method of the present invention.

Third Embodiment

Figure 12:
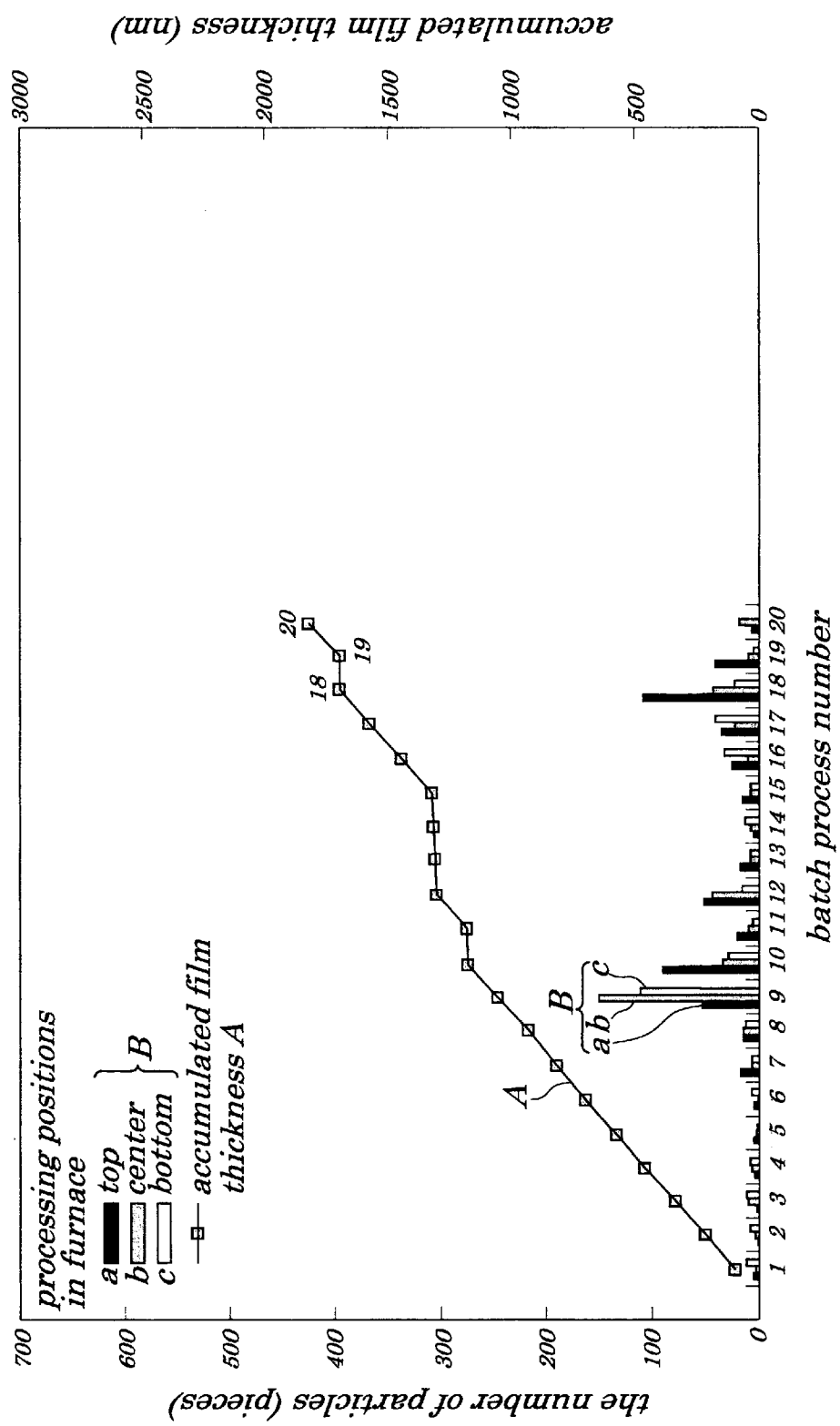
FIG. 12 is a graph showing the relationship between: the batch process numbers (in the abscissa); and, each of the number of particles (in the left-hand ordinate) and the accumulated film thickness of the unnecessary thin film (in the right-hand ordinate), according to the method of the third embodiment of the present invention.

FIG. 12 is a graph showing the relationship between: the batch process numbers (in the abscissa); and, each of the number of the contaminant particles 25 (in the left-hand ordinate) and the accumulated film thickness of the unnecessary thin film (in the right-hand ordinate), according to the method of a third embodiment of the present invention.

This third embodiment of the method of the present invention remarkably differs in construction from the second embodiment of the method of the present invention in that: it performs the stress eliminating process step once more for eliminating stress further provided in the unnecessary silicon nitride film 22 after completion of the film-forming process of the second embodiment of the method of the present invention.

In other words, after completion of the film-forming process according to the second embodiment of the method of the present invention, the jig 17 is unloaded from the reactor furnace 2 after completion of the 18th batch process for forming the thin film. Then, in the 19th batch process, both the stress eliminating process step and a repair-film forming process step for forming the repair film 24 to cover the unnecessary thin film (i.e., silicon nitride film 22) are conducted under the same conditions as that of the stress eliminating process step and of the repair-film forming process step both conducted in the second embodiment of the method of the present invention. After that, the 20th batch process subsequent to the 19th batch process is performed for forming the desired thin film.

As described above, in the 19th batch process, both the stress eliminating process step and the repair-film forming process step are sequentially conducted. As a result, as is clear from the graph shown in FIG. 12, there is substantially no increase of the accumulated film thickness of the unnecessary silicon nitride film 22 between the 18th and the 19th batch process. After completion of the 19th batch process, even when the 20th batch process is performed, the number of the contaminant particles 25 is considerably reduced. This is because the unnecessary silicon nitride film 22 is effectively stabilized in properties through the stress eliminating process steps conducted in the 19th batch process and followed by the repair-film forming process steps, and thereby preventing the contaminant particles 25 from being produced therefrom.

As described above, also in this third embodiment of the method of the present invention, it is possible to obtain substantially the same effect as that obtained in the second embodiment of the method of the present invention.

Fourth Embodiment

Figure 13:
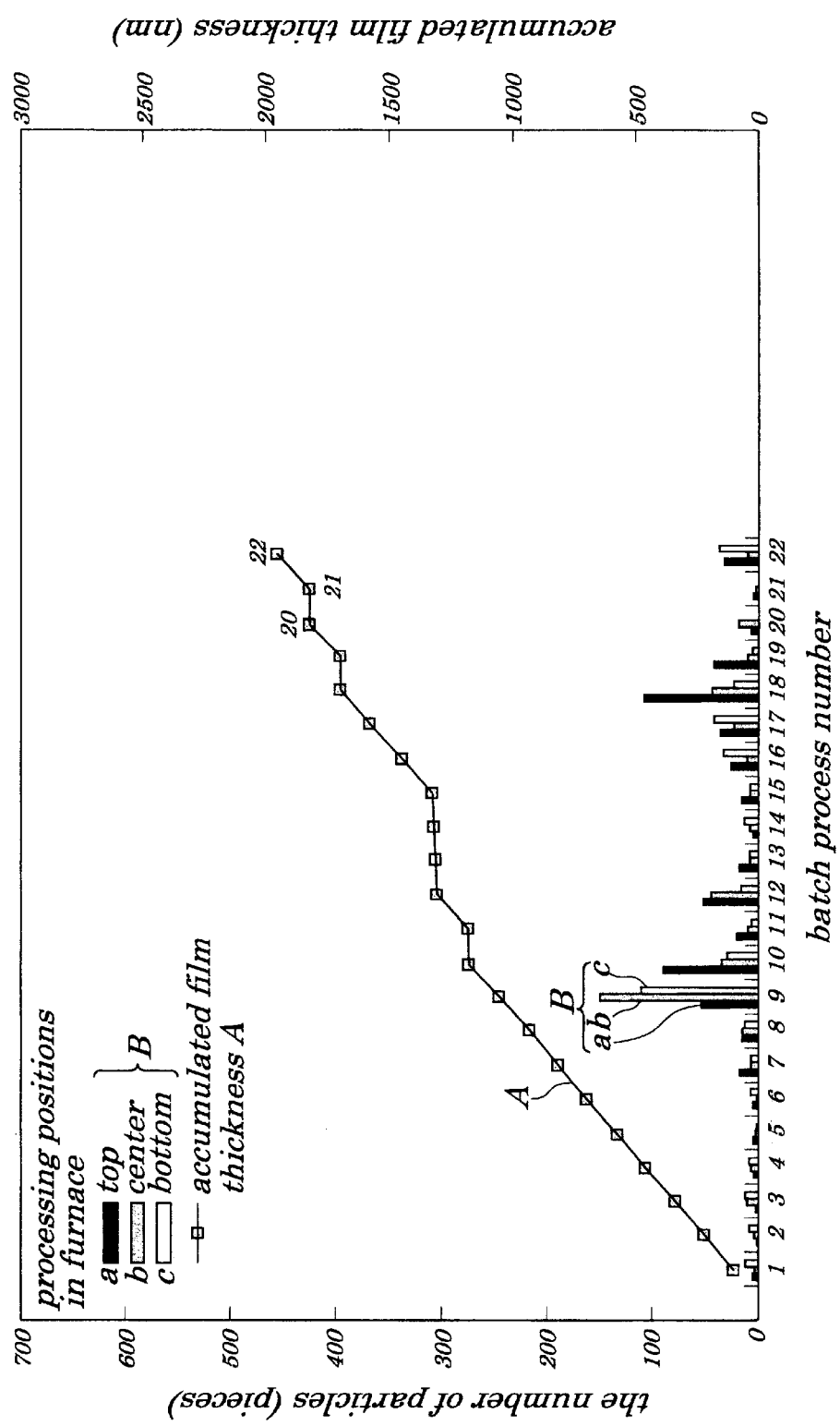
FIG. 13 is a graph showing the relationship between: the batch process numbers (in the abscissa); and, each of the number of particles (in the left-hand ordinate) and the accumulated film thickness of the unnecessary thin film (in the right-hand ordinate), according to the method of the fourth embodiment of the present invention.

FIG. 13 is a graph showing the relationship between: the batch process numbers (in the abscissa); and, each of the number of the contaminant particles 25 (in the left-hand ordinate) and the accumulated film thickness of the unnecessary thin film (in the right-hand ordinate), according to the method of a fourth embodiment of the present invention.

This fourth embodiment of the method of the present invention remarkably differs in construction from the third embodiment of the method of the present invention in that: it performs the stress eliminating process step once more for eliminating stress further provided in the unnecessary silicon nitride film 22 after completion of the film-forming process of the third embodiment of the method of the present invention.

In other words, after completion of the film-forming process according to the third embodiment of the method of the present invention, the jig 17 is unloaded from the reactor furnace 2 after completion of the 20th batch process for forming the desired thin film. Then, in the 21st batch process, both the stress eliminating process step and the repair-film forming process step for forming the repair film 24 to cover the unnecessary thin film (i.e., silicon nitride film 22) are conducted under the same conditions as that of the stress eliminating process step and of the repair-film forming process step both conducted in the third embodiment of the method of the present invention. After that, the 22nd batch process subsequent to the 21st batch process is performed for forming the desired thin film.

As described above, in the 21st batch process, both the stress eliminating process step and the repair-film forming process step are sequentially conducted. As a result, as is clear from the graph shown in FIG. 13, there is substantially no increase of the accumulated film thickness of the unnecessary silicon nitride film 22 between the 20th and the 21st batch process. After completion of the 21st batch process, even when the 22nd batch process is performed, the number of the contaminant particles 25 is considerably reduced. This is because the unnecessary silicon nitride film 22 is effectively stabilized in properties through the stress eliminating process steps conducted in the 21st batch process and followed by the repair-film forming process steps, and thereby preventing the contaminant particles 25 from being produced therefrom.

As described above, also in this fourth embodiment of the method of the present invention, it is possible to obtain substantially the same effect as that obtained in the third embodiment of the method of the present invention.

Fifth Embodiment

Figure 14:
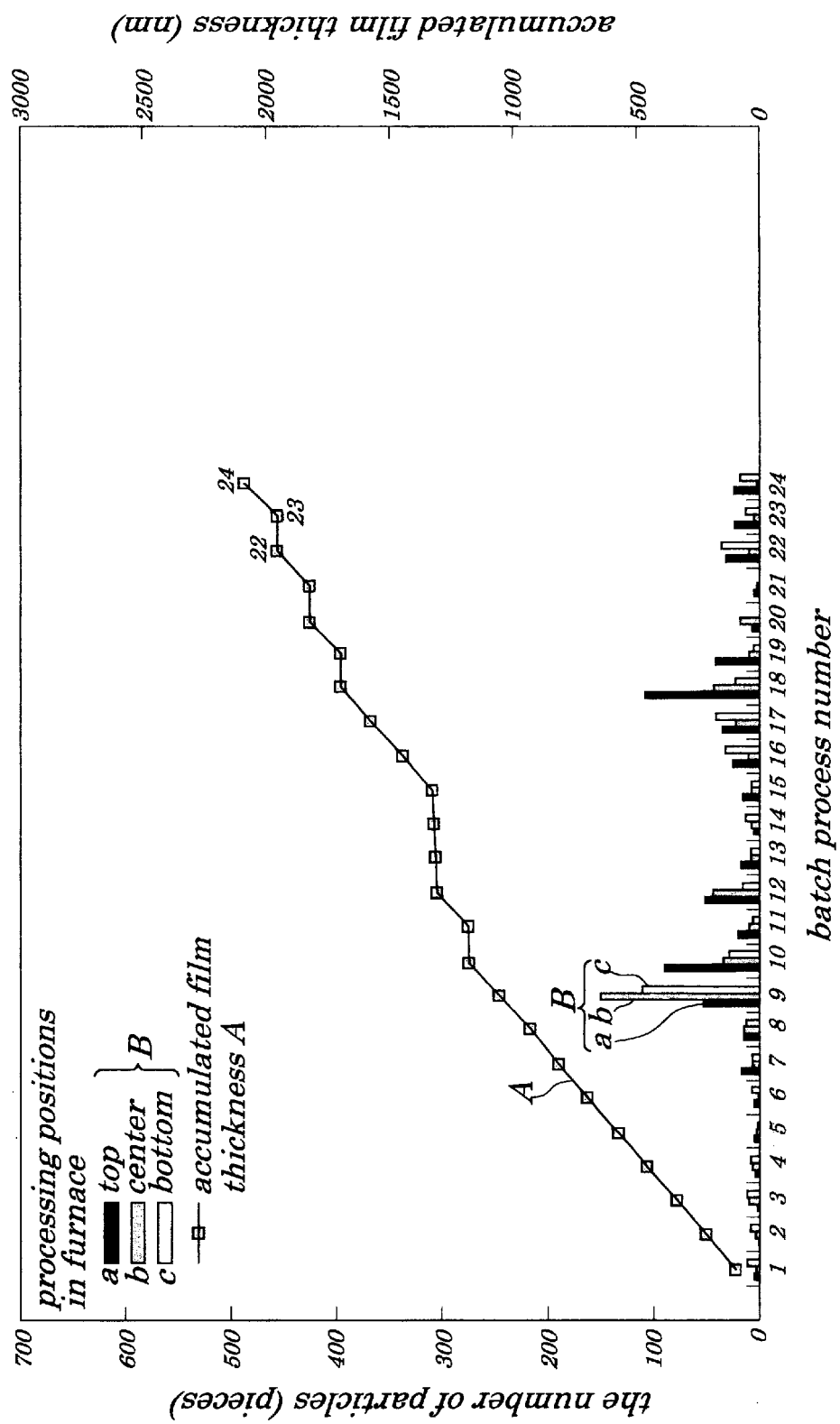
FIG. 14 is a graph showing the relationship between: the batch process numbers (in the abscissa); and, each of the number of particles (in the left-hand ordinate) and the accumulated film thickness of the unnecessary thin film (in the right-hand ordinate), according to the method of the fifth embodiment of the present invention.

FIG. 14 is a graph showing the relationship between: the batch process numbers (in the abscissa); and, each of the number of the contaminant particles 25 (in the left-hand ordinate) and the accumulated film thickness of the unnecessary thin film (in the right-hand ordinate), according to the method of a fifth embodiment of the present invention.

This fifth embodiment of the method of the present invention remarkably differs in construction from the fourth embodiment of the method of the present invention in that: it performs the stress eliminating process step once more for eliminating stress further provided in the unnecessary silicon nitride film 22 after completion of the film-forming process of the fourth embodiment of the method of the present invention.

In other words, after completion of the film-forming process according to the fourth embodiment of the method of the present invention, the jig 17 is unloaded from the reactor furnace 2 after completion of the 22nd batch process for forming the desired thin film. Then, in the 23rd batch process, both the stress eliminating process step and the repair-film forming process step for forming the repair film 24 to cover the unnecessary thin film (i.e., silicon nitride film 22) are conducted under the same conditions as that of the stress eliminating process step and of the repair-film forming process step both conducted in the fourth embodiment of the method of the present invention. After that, the 24th batch process subsequent to the 23rd batch process is performed for forming the desired thin film.

As described above, in the 23rd batch process, both the stress eliminating process step and the repair-film forming process step are sequentially conducted. As a result, as is clear from the graph shown in FIG. 14, there is substantially no increase of the accumulated film thickness of the unnecessary silicon nitride film 22 between the 22nd and the 23rd batch process. After completion of the 23rd batch process, even when the 24th batch process is performed, the number of the contaminant particles 25 is considerably reduced. This is because the unnecessary silicon nitride film 22 is effectively stabilized in properties through the stress eliminating process steps conducted in the 23rd batch process and followed by the repair-film forming process steps, and thereby preventing the contaminant particles 25 from being produced therefrom.

As described above, also in this fifth embodiment of the method of the present invention, it is possible to obtain substantially the same effect as that obtained in the fourth embodiment of the method of the present invention.

Sixth Embodiment

Figure 15:
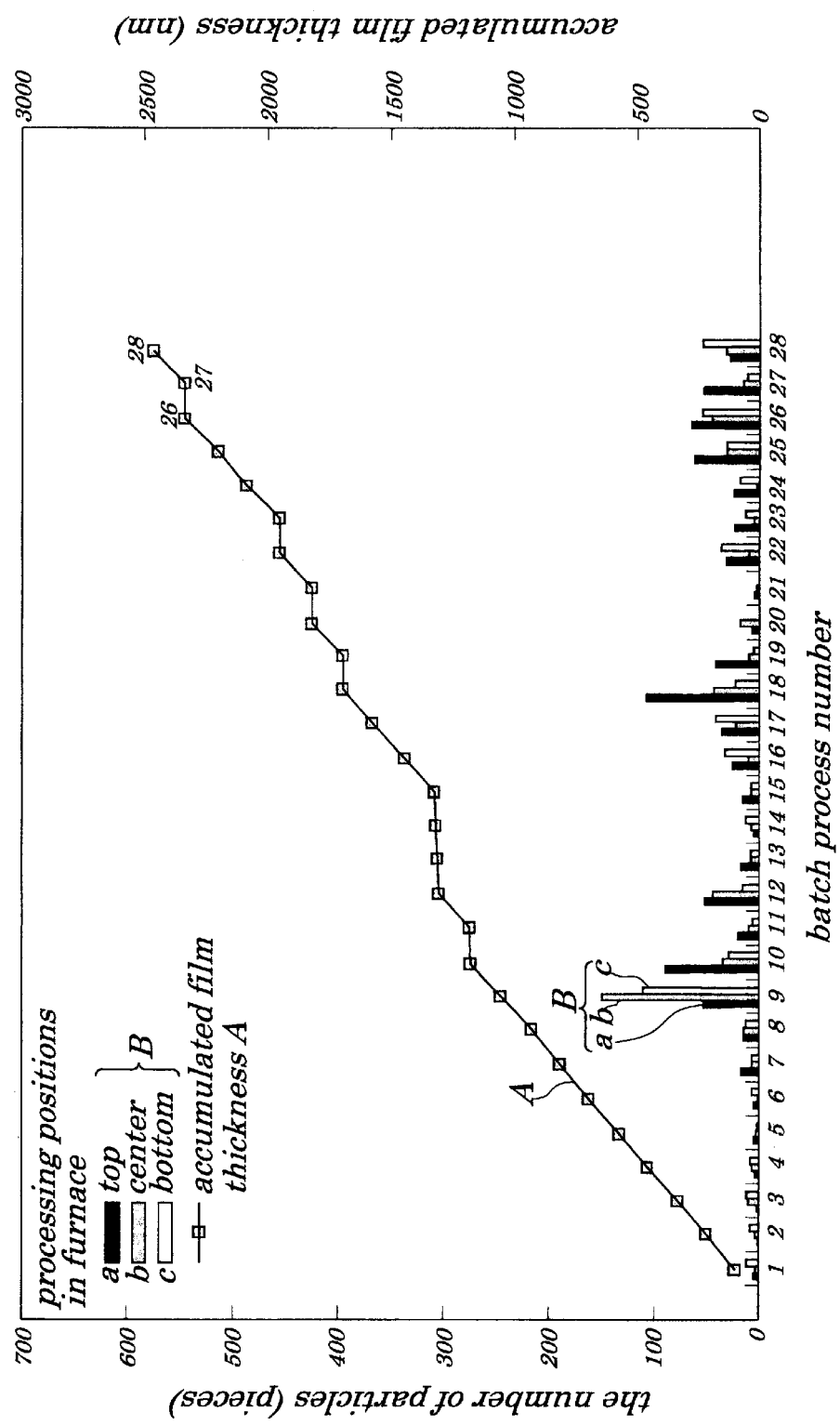
FIG. 15 is a graph showing the relationship between: the batch process numbers (in the abscissa); and, each of the number of particles (in the left-hand ordinate) and the accumulated film thickness of the unnecessary thin film (in the right-hand ordinate), according to the method of the sixth embodiment of the present invention.

FIG. 15 is a graph showing the relationship between: the batch process numbers (in the abscissa); and, each of the number of the contaminant particles 25 (in the left-hand ordinate) and the accumulated film thickness of the unnecessary thin film (in the right-hand ordinate), according to the method of a sixth embodiment of the present invention.

This sixth embodiment of the method of the present invention remarkably differs in construction from the fifth embodiment of the method of the present invention in that: it performs the stress eliminating process step once more for eliminating stress further provided in the unnecessary silicon nitride film 22 after completion of the film-forming process of the fifth embodiment of the method of the present invention.

In other words, after completion of the film-forming process according to the fifth embodiment of the method of the present invention, the jig 17 is unloaded from the reactor furnace 2 after completion of the 26th batch process for forming the desired thin film. Then, in the 27th batch process, both the stress eliminating process step and the repair-film forming process step for forming the repair film 24 to cover the unnecessary thin film (i.e., silicon nitride film 22) are conducted under the same conditions as that of the stress eliminating process step and of the repair-film forming process step both conducted in the fifth embodiment of the method of the present invention. After that, the 28th batch process subsequent to the 27th batch process is performed for forming the desired thin film.

As described above, in the 27th batch process, both the stress eliminating process step and the repair-film forming process step are sequentially conducted. As a result, as is clear from the graph shown in FIG. 15, there is substantially no increase of the accumulated film thickness of the unnecessary silicon nitride film 22 between the 26th and the 27th batch process. After completion of the 27th batch process, even when the 28th batch process is performed, the number of the contaminant particles 25 is considerably reduced. This is because the unnecessary silicon nitride film 22 is effectively stabilized in properties through the stress eliminating process steps conducted in the 27th batch process and followed by the repair-film forming process steps, and thereby preventing the contaminant particles 25 from being produced therefrom.

As described above, also in this sixth embodiment of the method of the present invention, it is possible to obtain substantially the same effect as that obtained in the fifth embodiment of the method of the present invention.

Seventh Embodiment

Figure 16:
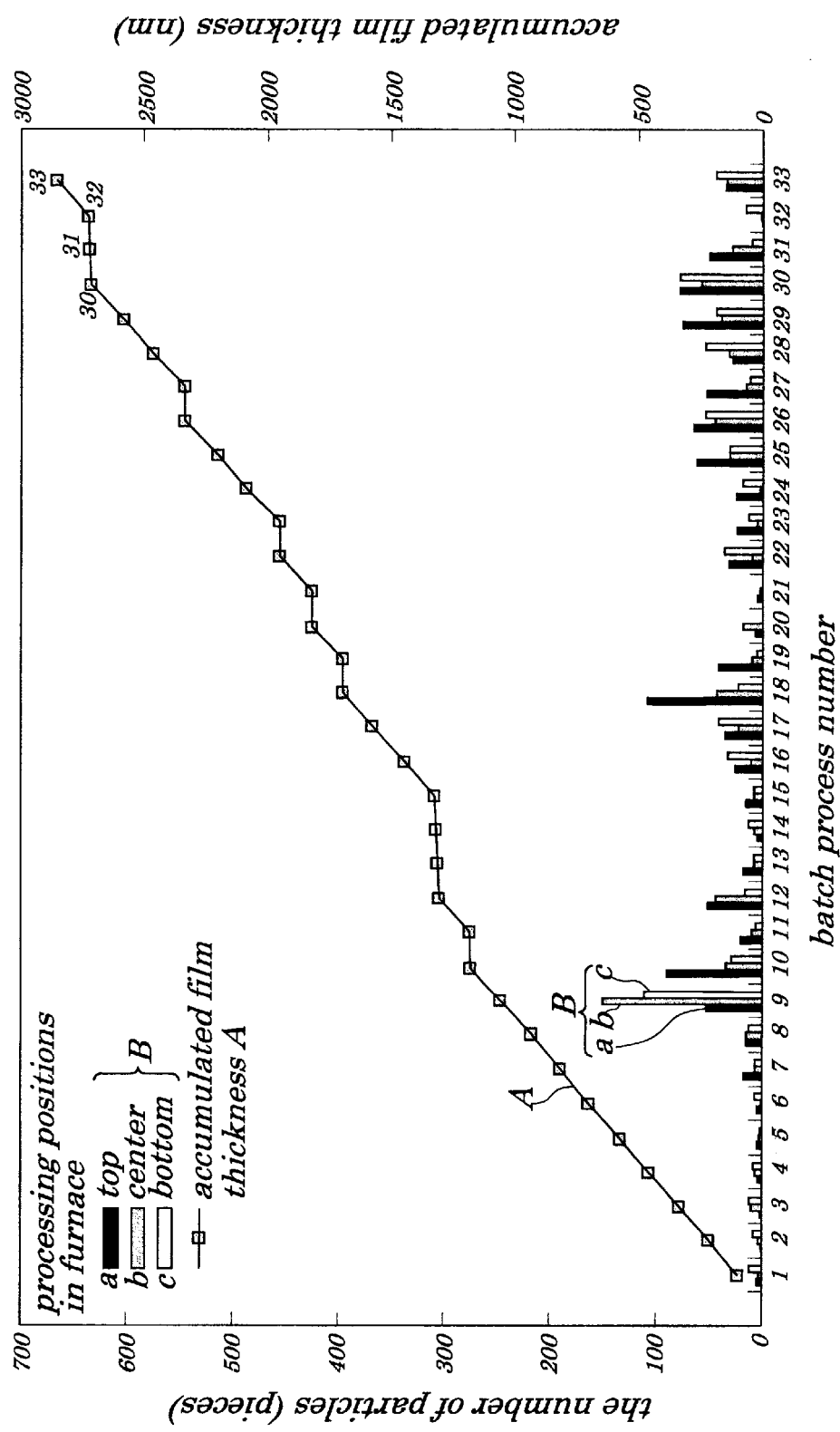
FIG. 16 is a graph showing the relationship between: the batch process numbers (in the abscissa); and, each of the number of particles (in the left-hand ordinate) and the accumulated film thickness of the unnecessary thin film (in the right-hand ordinate), according to the method of the seventh embodiment of the present invention.
Figure 17:
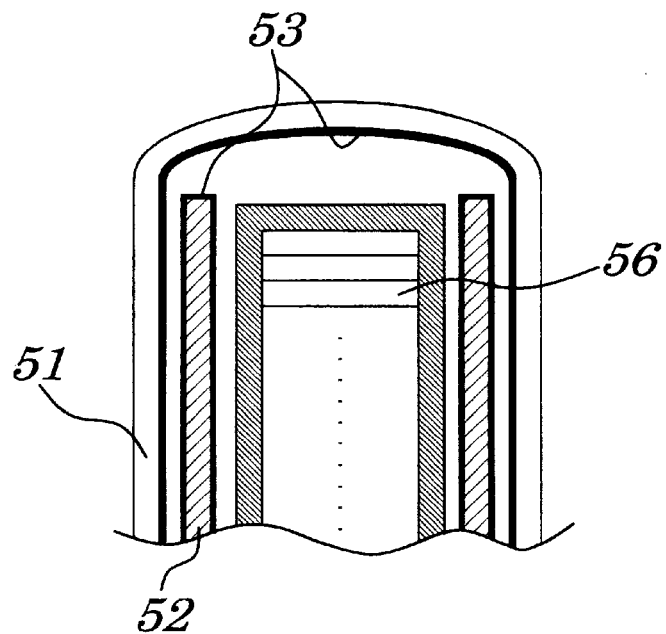
FIG. 17 is a longitudinal sectional view of an upper portion of a LPCVD unit used in a conventional method for forming a desired thin film.
Figure 18:
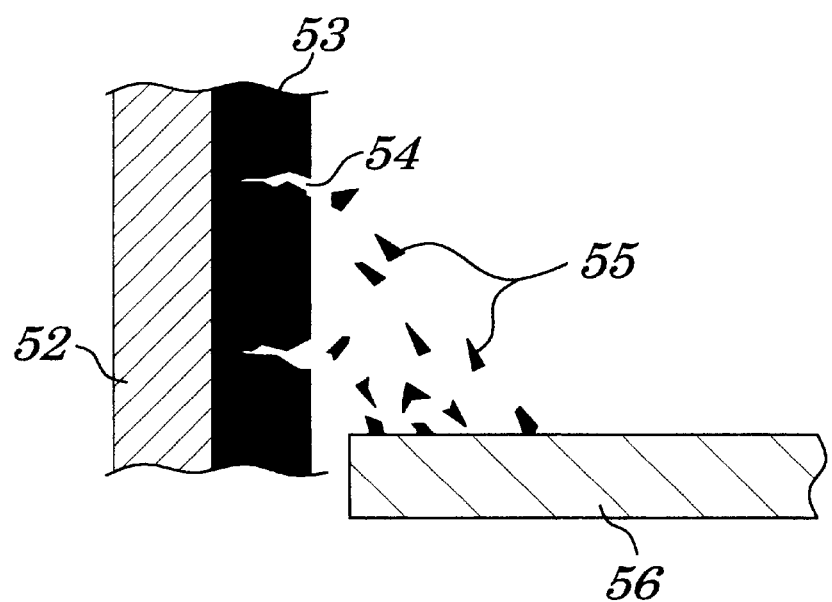
FIG. 18 is an enlarged sectional view of a part of the upper portion of the LPCVD unit used in the conventional method for forming the desired thin film, illustrating the accumulated film suffering from its cracks, which scatter its particles on the surface of the semiconductor substrate.

FIG. 16 is a graph showing the relationship between: the batch process numbers (in the abscissa); and, each of the number of the contaminant particles 25 (in the left-hand ordinate) and the accumulated film thickness of the unnecessary thin film (in the right-hand ordinate), according to the method of a seventh embodiment of the present invention.

This seventh embodiment of the method of the present invention remarkably differs in construction from the sixth embodiment of the method of the present invention in that: it performs the stress eliminating process step once more for eliminating stress further provided in the unnecessary silicon nitride film 22 after completion of the film-forming process of the sixth embodiment of the method of the present invention.

In other words, after completion of the film-forming process according to the sixth embodiment of the method of the present invention, the jig 17 is unloaded from the reactor furnace 2 after completion of the 30th batch process for forming the desired thin film. Then, in the 31st batch process, both the stress eliminating process step and the repair-film forming process step for forming the repair film 24 to cover the unnecessary thin film (i.e., silicon nitride film 22) are conducted under the same conditions as that of the stress eliminating process step and of the repair-film forming process step both conducted in the sixth embodiment of the method of the present invention. After that, in the 32nd batch process subsequent to the 31st batch process, both the stress eliminating process step and the repair-film forming process step for forming the repair film 24 to cover the unnecessary thin film (i.e., silicon nitride film 22) are further conducted under the same conditions as that of the stress eliminating process step and of the repair-film forming process step both conducted in the sixth embodiment of the method of the present invention. Then, the 33rd batch process subsequent to the 32nd batch process is performed for forming the desired thin film.

As described above, in each of the 31st and the 32nd batch process, both the stress eliminating process step and the repair-film forming process step are sequentially conducted. As a result, as is clear from the graph shown in FIG. 16, there is substantially no increase of the accumulated film thickness of the unnecessary silicon nitride film 22 between the 30th and the 32nd batch process. After completion of the 32nd batch process, even when the 33rd batch process is performed, the number of the contaminant particles 25 is considerably reduced. This is because the unnecessary silicon nitride film 22 is effectively stabilized in properties through the stress eliminating process steps conducted in each of the 31st and the 32nd batch process and followed by the repair-film forming process steps, and thereby preventing the contaminant particles 25 from being produced therefrom.

As described above, also in this seventh embodiment of the method of the present invention, it is possible to obtain substantially the same effect as that obtained in the sixth embodiment of the method of the present invention.

Although the embodiments of the present invention have been described in detail with reference to the accompanying drawings in the above, it should be understood that various modifications and changes may be made without departing from the spirit of the present invention, and therefore all these modifications and changes are in the scope of the present invention. For example, in the above embodiments of the present invention, both the stress eliminating and the repair-film forming process step have been described to be repeatedly conducted up to the 32nd batch process. However, it is also possible to repeatedly conduct these process steps even in a batch process subsequent to the 32nd batch process. As described above, by increasing the number of these stress eliminating process steps and the repair-film forming process steps, it is possible to prevent the accumulated film thickness of the unnecessary silicon nitride film 22 from increasing and also possible to prevent the contaminant particles 25 from being produced. Consequently, it is possible to do the maintenance at relatively long regular time intervals in comparison with the prior art.

Further, although the stress eliminating process step has been described to be conducted by lowering the temperature of the unnecessary silicon nitride film 22 from its film-forming temperature to a temperature less than the film-forming temperature in the above, it is also possible to perform this stress eliminating process step by increasing the temperature of the unnecessary silicon nitride film 22 from its film-forming temperature to a temperature higher than the film-forming temperature. Namely, after the unnecessary silicon nitride film 22 is formed, when this film 22 is changed in temperature other than the film-forming temperature, the unnecessary silicon nitride film 22 is subjected to a difference in temperature, which makes it possible to intentionally crack the unnecessary silicon nitride film 22 so as to relieve the film 22 from its stress. Further, in the case that the unnecessary silicon nitride film 22 is intentionally cracked, it is also possible to crack the unnecessary silicon nitride film 22 inside the reactor furnace 2 in which the semiconductor substrates 20 still remain. Further, the desired silicon nitride film 21 formed according to the method of the present invention is applicable in construction to other electronic components such as capacitors or the like.

Further, in the method of the present invention, the desired thin film formed on the semiconductor substrate 20 is not limited to silicon nitride film. In other words, any suitable insulation film may be formed according to the method of the present invention, for example such as silicon oxide films, aluminum oxide (i.e., alumina) films, or the like Further, in addition to these insulation films, it is also possible for the present invention to form polysilicon films, amorphous films, or like conductive films. Further, in addition to the semiconductor substrate, it is also possible for the present invention to form a desired thin film on any substrate, for example such as ceramic substrates or like dielectric substrates.

Still further, it is also possible for the present invention to use a horizontal type LPCVD unit in addition to the vertical type LPCVD unit 1 shown in FIG. 1. Further, in addition to the LPCVD units, it is also possible for the present invention to use the NPCVD (i.e., Normal Pressure Chemical Vapor Deposition) unit. In other words, the present invention is applicable to a so-called NPCVD method using the NPCVD unit.

Further, in the above embodiments of the present invention, all the values of parameters used therein in forming the desired thin film, for example such as those of temperatures, vacuum levels, gas flow rates and like parameters are mere illustrative values, and therefore adjustable in accordance with purposes, application fields and the other necessary factors in application.

Finally, the present application claims a Convention Priority based on Japanese Patent Application No. Hei10-313724 filed on Nov. 4, 1998, which is herein incorporated by reference.

What is claimed is:

1. A method for forming a desired thin film on a substrate having been loaded into a reactor furnace of a chemical vapor deposition unit into which a reactant gas is introduced, comprising the steps of:

forming said desired thin film on said substrate;

relieving at least an unnecessary thin film from stress, said unnecessary thin film being formed on a wall of said reactor furnace; and covering said unnecessary thin film thus relieved from the stress with a repair film.

2. The method for forming the desired thin film, according to claim 1, wherein: relief of said unnecessary thin film from the stress is provided after said substrate is unloaded from said reactor furnace, on which substrate said desired thin film has been formed.

3. The method for forming the desired thin film, according to claim 1, wherein: relief of said unnecessary thin film from the stress is provided by intentionally cracking said unnecessary thin film.

4. The method for forming the desired thin film, according to claim 3, wherein: means for intentionally cracking said unnecessary thin film is realized by changing in temperature the interior of said reactor furnace from a film-forming temperature of said desired thin film to another temperature other than said film-forming temperature after completion of formation of said desired thin film.

5. The method for forming the desired thin film, according to claim 4, wherein: said unnecessary thin film is covered with said repair film at said another temperature other than said film-forming temperature of the desired thin film.

6. The method for forming the desired thin film, according to claim 4, wherein: said another temperature other than said film-forming temperature of the desired thin film is lower than said film-forming temperature.

7. The method for forming the desired thin film, according to claim 4, wherein: said another temperature other than said film-forming temperature of the desired thin film is higher than said film-forming temperature.

8. The method for forming the desired thin film, according to claim 1, wherein: after said unnecessary thin film is covered with said repair film, a new substrate on which a desired thin film should be formed is loaded into said reactor furnace, and said desired thin film is formed on said new substrate.

9. A method for forming a desired thin film on a substrate having been loaded into a reactor furnace of a chemical vapor deposition unit into which a reactant gas is introduced, comprising the steps of:

forming said desired thin film on said substrate;

relieving at least an unnecessary thin film from stress by lowering in temperature the interior of said reactor furnace from a film-forming temperature of said desired thin film to another temperature lower than said film-forming temperature, wherein said unnecessary thin film is formed on a wall of said reactor furnace when said desired thin film is formed; and forming a repair film to cover said unnecessary thin film therewith at said another temperature lower than said film-forming temperature of the desired thin film.

10. The method for forming the desired thin film, according to claim 9, wherein: after completion of said step of forming said desired thin film on said substrate, said substrate on which said desired thin film has been formed is unloaded from said reactor furnace.

11. The method for forming the desired thin film, according to claim 9, wherein: after completion of said step of forming said desired thin film on said substrate, a new substrate on which a desired thin film should be formed is loaded into said reactor furnace so that said desired thin film is formed on said new substrate.

12. The method for forming the desired thin film, according to claim 9, wherein: said reactor furnace is formed of quartz; and, each of said desired thin film, said unnecessary thin film and said repair film is formed of silicon nitride film.

13. The method for forming the desired thin film, according to claim 12, wherein: said step of relieving said unnecessary thin film formed of silicon nitride film from the stress is performed by intentionally cracking said unnecessary thin film.

* * * * *